US012610867B2

(12) United States Patent
    Park et al.

(10) Patent No.: US 12,610,867 B2
(45) Date of Patent: Apr. 21, 2026

(54) DISPLAY DEVICE

(71) Applicant: Samsung Display Co., LTD., Yongin-si (KR)

(72) Inventors: Young Min Park, Yongin-si (KR); Dong Hyeon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 545 days.

(21) Appl. No.: 18/079,084

(22) Filed: Dec. 12, 2022

(65) Prior Publication Data

US 2023/0326915 A1     Oct. 12, 2023

(30) Foreign Application Priority Data

Apr. 7, 2022   (KR) ......................... 10-2022-0043379

(51) Int. Cl.
    *H01L 25/16*        (2023.01)
    *H10H 20/85*        (2025.01)
    *H10H 20/855*       (2025.01)
    *H10H 20/857*       (2025.01)
    *H10K 59/65*        (2023.01)
    *G06V 40/13*        (2022.01)
    *H10K 59/12*        (2023.01)
    *H10K 77/10*        (2023.01)
    *H10K 102/00*       (2023.01)

(52) U.S. Cl.
    CPC ....... *H01L 25/167* (2013.01); *H10H 20/8506* (2025.01); *H10H 20/855* (2025.01); *H10H 20/857* (2025.01); *H10K 59/65* (2023.02);

*G06V 40/1318* (2022.01); *H10K 59/12* (2023.02); *H10K 77/111* (2023.02); *H10K 2102/311* (2023.02)

(58) Field of Classification Search
    CPC .............. H01L 25/167; H10H 20/8506; H10H 20/855; H10H 20/857; H10H 20/856; H10K 59/65; H10K 59/12; H10K 77/111; H10K 2102/311; H10K 59/60; H10K 50/8426; H10K 50/856; H10K 50/858; H10K 50/865; H10K 59/122; H10K 59/131; G06V 40/1318
    See application file for complete search history.

(56) References Cited

FOREIGN PATENT DOCUMENTS

| CN | 111323947 | 6/2020 |
| CN | 211403017 | 9/2020 |
| CN | 113343825 | 9/2021 |
| KR | 10-2017-0106425 | 9/2017 |

*Primary Examiner* — Elmito Breval
(74) *Attorney, Agent, or Firm* — F. CHAU & ASSOCIATES, LLC

(57) ABSTRACT

A display device includes a main region including an active region; a bending region extending from a side of the main region in a direction; a plurality of pixels disposed in the active region and emitting light; a plurality of light sensors disposed in the active region and sensing incident light; a protrusion pattern protruding from the side of the main region in the direction; and a light source part mounted on the protrusion pattern and emitting light.

20 Claims, 12 Drawing Sheets

PX: LEL, PDU
PS: PD, SDU

DISPLAY DEVICE

CROSS-REFERENCE TO RELATED APPLICATION

This application claims priority to and benefits of Korean Patent Application No. 10-2022-0043379 under 35 U.S.C. 119, filed in the Korean Intellectual Property Office on Apr. 7, 2022, the contents of which are incorporated herein by reference.

BACKGROUND

1. Technical Field

The disclosure relates to a display device capable mounting a light source part without a separate configuration.

2. Description of the Related Art

Display devices are employed in a variety of electronic devices such as a smart phone, a tablet PC, a laptop computer, a monitor and a television. With the recent advance of mobile communication technology, the use of portable electronic devices such as a smartphone, a tablet, and a notebook computer has increased enormously. As privacy information is stored in portable electronic devices, fingerprint authentication has been used to verify a user's fingerprint, which is biometric information, in order to protect such privacy information.

For example, the display device may authenticate a user's fingerprint using an optical method, an ultrasonic method, a capacitive method, or the like. The optical method may authenticate the user's fingerprint by detecting light reflected from the user's fingerprint. The display device may include a display panel including pixels for displaying an image and light sensors for sensing light, in order to optically authenticate the user's fingerprint.

Recently, research and development are being conducted on a technology for integrating light sensors for touch recognition or fingerprint recognition to display an image in a display panel.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device capable of mounting a light source part without a separate configuration.

However, embodiments of the disclosure are not limited to those set forth herein. The above and other embodiments will become more apparent to one of ordinary skill in the art to which the disclosure pertains by referencing the detailed description of the disclosure given below.

An embodiment of a display device includes a main region including an active region; a bending region extending from a side of the main region in a direction; a plurality of pixels disposed in the active region and emitting light; a plurality of light sensors disposed in the active region and sensing incident light; a protrusion pattern protruding from the side of the main region in the direction; and a light source part mounted on the protrusion pattern and emitting light.

The protrusion pattern may be arranged parallel to the bending region in another direction intersecting the direction.

The display device may further include a slit portion disposed between the protrusion pattern and the bending region. The protrusion pattern and the bending region may be physically separated by the slit portion.

The side of the main region in the direction may extend from the bending region and the protrusion pattern.

The protrusion pattern may include a first protrusion pattern and a second protrusion pattern. The bending region may be disposed between the first protrusion pattern and the second protrusion pattern in another direction intersecting the direction.

The display device may further include a window disposed on the plurality of pixels, the plurality of light sensors, and the light source part.

The display device may further include a transparent bonding member disposed between the window and the light source part. The light source part may be attached to the window via the transparent bonding member.

The window may include an angular filter overlapping the light source part in a plan view. The angular filter may include an optical multilayer, and the optical multilayer may include a plurality of low refractive layers and a plurality of high refractive layers alternatively disposed.

The angular filter may further include an ink layer absorbing light of a visible wavelength band and transmitting light of an infrared wavelength band.

The display device may further include a non-active region adjacent to the active region, the non-active region including a first region overlapping the light source part in a plan view and a second region not overlapping the light source part in a plan view; an angular filter disposed below a rear surface of the window, the angular filter disposed in the first region of the non-active region; and a black matrix disposed below the rear surface of the window, the black matrix disposed in the second region of the non-active region.

The light source part may include a light emitting chip emitting light of infrared wavelength band, a first lead frame electrically connected to an end portion of the light emitting chip, a second lead frame electrically connected to another end portion of the light emitting chip, and a reflector providing a space in which the light emitting chip is mounted.

The light source part may be electrically connected to a light source voltage line extending from the bending region toward the protrusion pattern. The light source voltage line may supply a power of a first polarity and a power of a second polarity different from the first polarity to the light source part.

The plurality of pixels may emit light of visible wavelength band. The light source part may emit light of infrared wavelength band.

The plurality of light sensors may sense light of the infrared wavelength band.

An embodiment of a display device includes a display panel including a plurality of pixels emitting light and a plurality of light sensors sensing incident light; a protrusion pattern protruding from a side of the display panel in a direction; a light source part mounted on the protrusion pattern; and a window disposed on the display panel, the protrusion pattern, and the light source part. The light source part is attached to the window via a transparent bonding member.

The display device may further include an angular filter disposed below a rear surface of the window. The angular filter may overlap the light source part in a plan view.

The angular filter may include an optical multilayer sequentially stacked in a thickness direction of the display panel and an ink layer. The optical multilayer may include a plurality of low refractive layers and a plurality of high refractive layers. The plurality of low refractive layers and the plurality of high refractive layers of the optical multilayer may be alternatively disposed. The ink layer may absorb light of visible wavelength band.

The light source part, the transparent bonding member, the angular filter, and the window may be sequentially stacked in a thickness direction of the display panel.

The display panel may include a main region including the plurality of pixels and the plurality of light sensors, a sub-region including a pad portion, and a bending region disposed between the sub-region and the main region. The protrusion pattern may be arranged parallel to the bending region.

The display panel may include a substrate, a pixel electrode disposed on the substrate, a sensing electrode disposed on the substrate, a pixel defining layer exposing the pixel electrode and the sensing electrode, a light emitting layer disposed on the pixel electrode, a photoelectric conversion layer disposed on the sensing electrode, and a common electrode disposed on the light emitting layer, the photoelectric conversion layer, and the pixel defining layer.

The display device according to embodiments may include a protruding pattern that protrudes from a side of a display panel. Since the protruding pattern provides a space to mount a light source part that functions as a light source, a separate circuit substrate to mount the light source part may be omitted.

In the display device according to embodiments, since a window may cover the display panel and the protruding pattern, the light source part may be covered by the window.

It should be noted that the effects of the disclosure are not limited to those described above, and other effects of the disclosure will be apparent from the following description.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
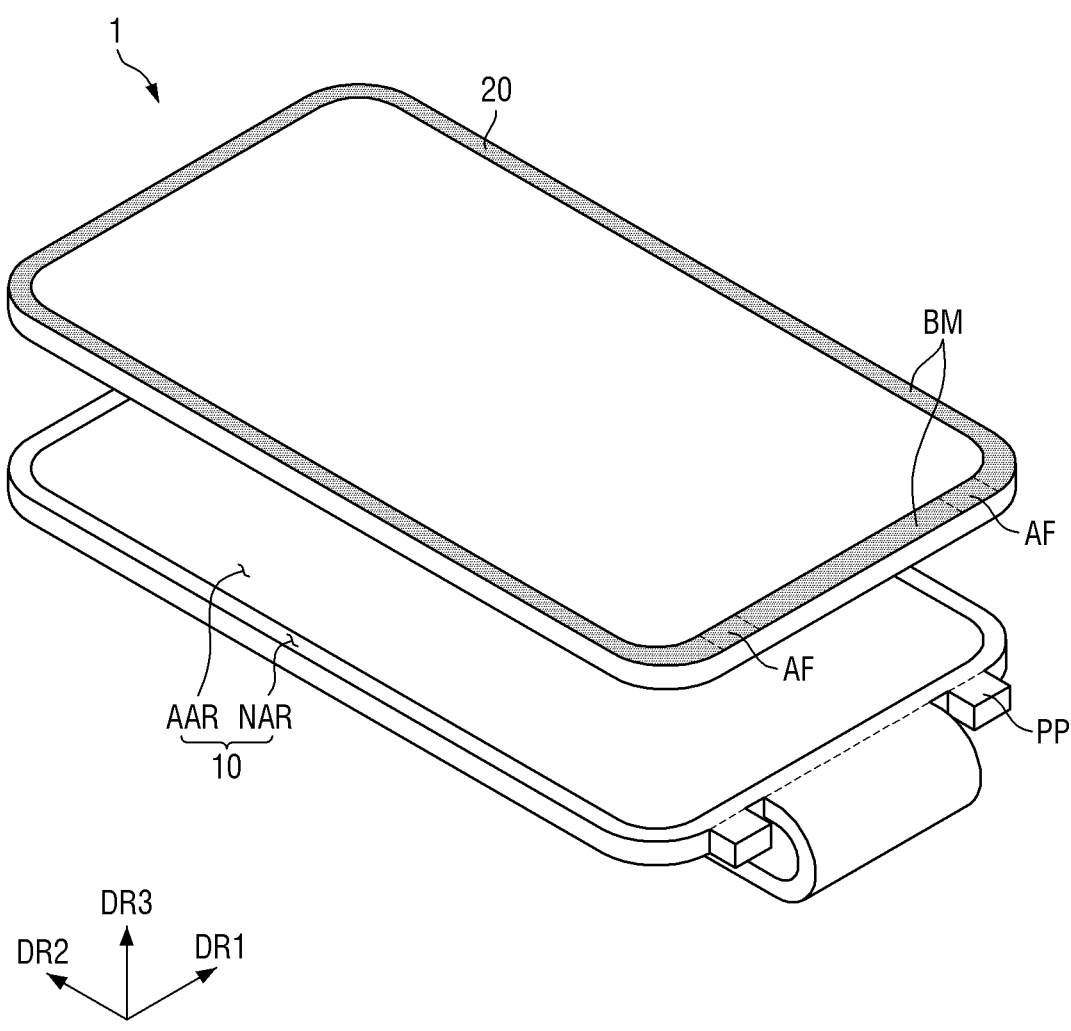
FIG. 1 is a schematic perspective view of a display device according to an embodiment.

In the following description, for the purpose of explanation, numerous specific details set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

Like reference numbers denote like elements. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

The use of cross-hatching and/or shading in the accompanying drawings is generally provided to clarify boundaries between adjacent elements. As such, neither the presence nor the absence of cross-hatching or shading conveys or indicates any presence of requirement for particular materials, material properties, dimensions, proportions, commonalities between illustrated elements and/or any other characteristic, attribute, property, etc., of the elements, unless specified.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 2:
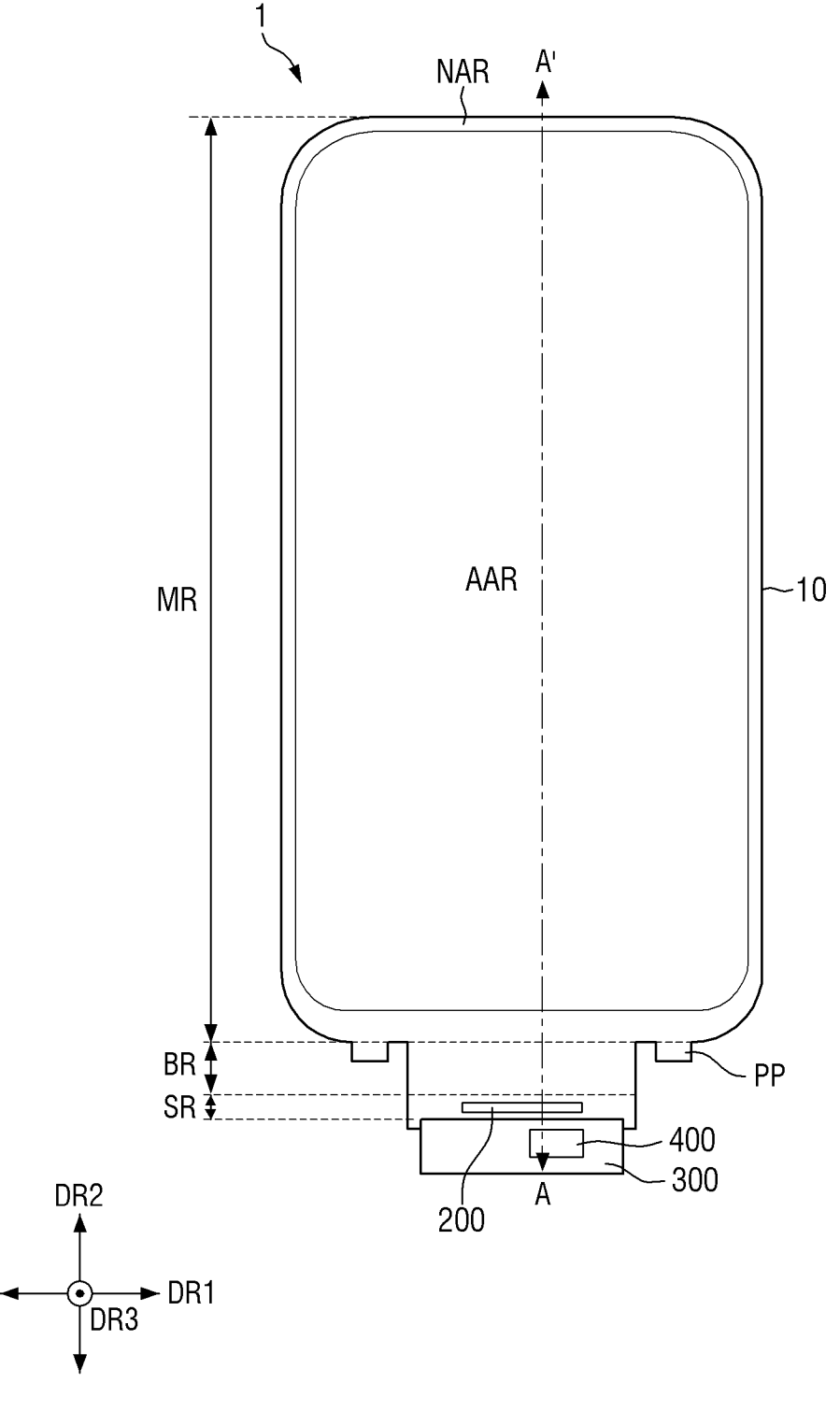
FIG. 2 is a schematic plan view of a display panel of a display device according to an embodiment.

FIG. 1 is a schematic perspective view of a display device according to an embodiment. FIG. 2 is a schematic plan view of a display panel of a display device according to an embodiment.

In FIGS. 1 and 2, a first direction DR1, a second direction DR2, and a third direction DR3 are shown. The first direction DR1 may be a direction parallel to a side of a display device 1 in a plan view. For example, the first direction DR1 may be a horizontal direction of the display device 1. The second direction DR2 may be a direction parallel to another side in contact with the above side of the display device 1 in a plan view and may be a vertical direction of the display device 1. For ease of description, a side in the first direction DR1 is referred to as a right direction in a plan view, another side in the first direction DR1 is referred to as a left direction in a plan view, a side in the second direction DR2 is referred to as an upward direction in a plan view, and another side in the second direction DR2 is referred to as a downward direction in a plan view. The third direction DR3 may be a thickness direction of the display device 1. It should be understood, however, that a direction mentioned in the embodiment refers to a relative direction and the embodiment is not limited to the direction mentioned.

Unless otherwise defined, with respect to the third direction DR3, the terms "above," and "top surface" as used herein refer to a display surface's side of a display panel 10, and the terms "below," "bottom surface" and "rear surface" as used herein refer to a side opposite to the display surface of the display panel 10. For example, "upper end portion" of the display pan& 10 refers to an upward direction in a plan view that is the side in the second direction. DR2, and the "lower end portion" of the display panel 10 refers to a downward direction in a plan view that is the another side in the second direction DR2.

Referring to FIGS. 1 and 2, the display device 1 may include various electronic devices that provide a display screen. Examples of the display device 1 may include, but not limited to, a mobile phone, a smart phone, a tablet personal computer (PC), a mobile communication terminal, an electronic notebook, an electronic book, a personal digital assistant (PDA), a portable multimedia player (PMP), a navigation device, an ultra-mobile PC (UMPC), a television, a game console, a wrist watch type electronic device, a head-mounted display, a personal computer monitor, a laptop computer, a car dashboard, a digital camera, a camcorder, an external billboard, an electric billboard, various medical devices, various inspection devices, various home appliances including a display area such as a refrigerator or a washing machine, an Internet-of-Things (IoT) device, and the like. A typical example of the display device 1 to be described later may be a smart phone, a tablet PC, or a laptop computer, but is not limited thereto.

The display device 1 may include a display panel 10, a display driving circuit 200, a circuit board 300, and a read-out circuit 400. For example, the display device 1 may further include a window 20.

The display device 1 may include the display panel 10 having an active region AAR and a non-active region NAR.

The active region AAR may include a display area on which a screen is displayed. The active region AAR may overlap (e.g., completely overlap) the display area in a plan view. Pixels PX (e.g., refer to FIG. 4) that display an image may be disposed in the display area. Each pixel PX may include a light emitting element LEL (e.g., refer to FIG. 10).

The active region AAR may further include a fingerprint sensing area. The fingerprint sensing area may be a region that reacts to (or sense) light, and may be configured to sense an amount of incident light or wavelength of incident light. The fingerprint sensing area may overlap the display area in a plan view. For example, the fingerprint sensing area may be defined as an area identical to (e.g., completely identical to) the active area AAR. The entire surface of the active area AAR may be used as a region for the fingerprint sensing. Light sensors (or photo sensors) PS (e.g., refer to FIG. 4) that react to (or sense) the light may be disposed in the fingerprint sensing area. Each light sensor PS may include a photoelectric conversion element PD (e.g., refer to FIG. 10) configured to detect incident light and convert the detected light into an electrical signal.

The non-active region NAR may be adjacent to (e.g., disposed around) the active region AAR. The non-active region NAR may be a bezel area. The non-active region NAR may be adjacent to sides (e.g., surround all sides or four sides in the drawing) of the active region AAR, but is not limited thereto.

The display panel 10 may include a flexible substrate including a flexible polymer material such as polyimide. Accordingly, the display panel 10 may be twisted, bent, folded, or rolled.

The display panel 10 may include a bending region BR, which is a region in which the display panel 10 is bent. The display panel 10 may be divided into a first region and a second region with respect to the bending region BR. The first region of the display panel 10 may be disposed on a side of the bending region BR, and the second region of the display panel 10 may be disposed on another side of the bending region BR. The first region of the display panel may be a main region MR including the active area AAR. The second region may be a sub-region SR including a pad part DPI (e.g., refer to FIG. 4) The active region AAR of the display panel 10 may be disposed in the main region MR. Remaining area of the display panel 10 except the active region AAR may be the non-active region NAR. In an embodiment, a peripheral edge portion of the active region AAR, the entire bending region BR, and the entire sub-region SR may be the non-active region NAR in the main region MR. However, the disclosure is not limited thereto, and the bending region BR and/or the sub-region SR may include the active region AAR.

The main region MR may have a shape similar to an outer shape of the display device 1 in a plan view. The main region MR may be a flat region located on a surface of the display device 1. However, the disclosure is not limited thereto, and at least one edge of remaining edges except an edge (or side) of the main region MR, which extends from the bending region BR, may be bent in a curved shape or bent in a vertical direction.

The active region AAR of the display panel 10 may be located at a center of the main region MR. The active region AAR may have a rectangular shape or a rectangular shape with rounded corners. The shape of the active region (shown as an example) AAR may have rounded corners and may be a rectangular shape in which sides in the second direction DR2 are longer than sides in the first direction DR1. However, the disclosure is not limited thereto, and the active region AAR may have various shapes such as a rectangular shape in which sides in the first direction DR1 are longer than sides in the second direction DR2, a square shape, other polygonal shapes, a circular shape, an elliptical shape, or the like.

In case that at least one of the edges other than the edge of the main region MR extending to/from or connected to (hereinafter, "extending from") the bending region BR is curved or bent, the active region AAR may also be disposed on the corresponding edge (e.g., the curved or bent edge). However, the disclosure is not limited thereto, and a non-display area that does not display the screen may be disposed on the curved or bent edge. For example, both the display area and the non-display area may be disposed thereon (e.g., on the curved or bent edge).

The non-active region NAR may be adjacent to (e.g., located around) the active region AAR in the main region MR. The non-active region NAR of the main region MR may be placed in an area from an outer boundary (or outer side) of the active region AAR to the edge of the display panel 10. For example, the non-active region NAR of the main region MR may be disposed between the outer boundary of the active region AAR and the edge of the display panel 10. Signal lines or driving circuits may be disposed in the non-active region NAR of the main region MR and apply a signal to the display area and the fingerprint sensing area of the active region AAR.

The bending region BR may extend from a lower end, which is the another side in the second direction DR2, of the main region MR. For example, the bending region BR may extend from the main region MR through a lower short side (e.g., the lower end) of the main region MR. A width of the bending region BR may be smaller than a width (e.g., a width of the lower short side) of the main region MR. A connection portion between the main region MR and the bending region BR may have an L-shaped cut portion in a plan view.

In the bending region BR, the display panel 10 may be bent with a curvature downward in the thickness direction (i.e., in a direction opposite to the display surface) of the display panel 10. The bending region BR may have a constant radius of curvature. However, the disclosure is not limited thereto, and the bending region BR may have a different radius of curvature for each section thereof. The surface of the display panel 10 may be reversed when the display panel 10 is bent in the bending region BR. For example, a surface of the display panel 10 facing upward may be changed to face outward (or face a side thereof) through the bending region BR and face downward. For example, in case the display panel 10 is bent, the surface of the display panel 10 may face upward, outward, and downward, in sequence, and the display panel 10 is completely bent, the facing direction of the display panel 10 may be changed to be opposite to the original direction thereof.

The sub-region SR may extend from the bending region BR. The sub-region SR may extend in a direction parallel to the main region MR from a point (or a lower end of the bending region BR) where the bending of the bending region BR is completed. The sub-region SR may overlap the main region MR in the thickness direction of the display panel 10. The sub-region SR may overlap the non-active region NAR of the edge (e.g., the lower edge) of the main region MR in a plan view. For example, the sub-region SR may further overlap the active region AAR (e.g., a lower portion of the active region AAR) of the main region MR in a plan view.

The sub-region SR and the bending region BR may have a same width, but the disclosure is not limited thereto.

In an embodiment, the display panel 10 may include a protrusion pattern PP protruding from the main region MR toward the another side in the second direction DR2. The protrusion pattern PP may be disposed in the non-active region NAR. For example, the protrusion pattern PP may extend from the main region MR through the lower short side (or bottom short side) of the main region MR from the lower end of the display panel 10. The protrusion pattern PP may be formed in a region of the lower short sides of the main region MR that does not contact the bending region BR. Among the lower short sides of the main region MR, an outer region spaced apart from (or distanced from) a center of the short side may not contact the bending region BR. The protrusion pattern PP may extend from the outer region spaced apart from (or distanced from) the center of the short side among the lower short side of the main region MR. For example, the outer region (e.g., a left region) of the lower short side of the main region MR of the side in the first direction DR1 and another outer region (e.g., a right region) of the lower short side of the main region MR of the another side in the first direction DR1 may be spaced apart from the center among the lower short sides of the main region MR and may not contact the bending region BR. Thus, two protrusion patterns PP may extend from the outer region (e.g., the left region) of the side in the first direction DR1 and the another outer region (e.g., the right region) of the another side in the first direction DR1 among the lower short side of the main region MR.

The protrusion patterns PP may be disposed on the outside of the bending region BR. The protrusion patterns PP may be formed on both sides of the bending region BR. For example, the protrusion patterns PP may be spaced apart from and adjacent to the both sides of the bending region BR. For example, the protrusion patterns PP may be formed on the side and the another side in the first direction DR1 with respect to the bending region BR. However, the disclosure is not limited thereto, and a protrusion pattern PP may be formed only on a side of the bending region BR. The protrusion pattern PP may be spaced apart from the bending region BR of the display panel 10 in the first direction DR1. For example, the protrusion patterns PP may be parallel to each other. The protrusion patterns PP may not be parallel to the sub-region SR in the first direction DR1. The protrusion pattern PP may protrude from the lower end of the main region MR only enough to be covered by an angular filter AF of the window 20.

Although the disclosure is not limited thereto, the protrusion pattern PP may not be disposed on the side of the main region MR in the second direction DR2, the side of the main region MR in the first direction DR1, and the another side of the main region MR in the first direction DR1. In the drawings, the protrusion pattern PP may not be disposed on the top, left, or right side of the display panel 10. The protrusion pattern PP should be covered by the black matrix BM or the angular filter AF of the window 20, because the area occupied by the black matrix BM or the angular filter AF at the top, left, and right sides of the display panel 10 is smaller than the area of the lower end of the display panel 10. For example, the area covered by the black matrix BM of the angular filter AF at the top, left, and right sides of the display panel 10 is smaller than the area of the lower end of the display panel 10, and the protrusion pattern PP may be completely covered by the black matrix BM or the angular filter AF of the window 20.

A width of the protrusion pattern PP may be smaller than a width of the main region MR (e.g., a width of short sides) or the width of the bending region BR. A width of the protrusion pattern PP in the first direction DR1 may be greater than a width of the protrusion pattern PP in the second direction DR2, but is not limited thereto. A light source part 500 (e.g., refer to FIG. 4) implemented with (or functioning as) a light source for a light sensor may be disposed on the protrusion pattern PP of the display panel 10. Detailed description of the light source part 500 is provided below.

The display driving circuit 200 may be disposed on the sub-region SR of the display panel 10. The display driving circuit 200 may be formed as an integrated circuit (IC) which drives the display panel 10. In an embodiment, the display driving circuit 200 may be a data driving integrated circuit (DDI) that generates and provides data signals. The display driving circuit 200 may output signals and voltages driving the pixels PX and/or the light sensors PS. The display driving circuit 200 may be mounted on a surface of the display panel 10 which may be the display surface. In other embodiments, the display driving circuit 200 may be mounted on a surface (e.g., a lower surface or a bottom surface) of the display panel 10 facing the bottom side in the thickness direction as the bending region BR is bent and reversed and the top surface of the display driving circuit 200 faces downward.

The display driving circuit 200 may be attached on the display panel 10 with an anisotropic conductive film or an ultrasonic bonding. Surfaces (e.g., both surfaces) of the display driving circuit 200 may be spaced apart from the left and right edges, respectively.

The read-out circuit 400 may not be disposed in the sub-region SR. In other embodiments, the read-out circuit 400 may be disposed in the sub-region SR. The read-out circuit 400 may be electrically connected to each light sensor PS (e.g., refer to FIG. 4) through the signal line and may receive a current flowing in each light sensor PS to detect a user's fingerprint input. The read-out circuit 400 may be formed as an integrated circuit (IC) and attached on a display circuit board in a chip on film (COF) structure, but is not limited thereto, and may be attached on the non-active region NAR of the display panel 10 in a chip on glass (COG) method, a chip on plastic (COP) method, or an ultrasonic bonding method.

The circuit board 300 may be attached to an end (e.g., the lower end) of the display panel 10 using an anisotropic conductive film (ACF). Lead lines of the circuit board 300 may be electrically connected to pads of the display panel 10. The circuit board 300 may be a flexible film such as a flexible printed circuit board or a chip on film.

The window 20 may be a protective member disposed on the top of the display panel 10 and protect a configuration of the display panel 10. The window 20 may have a size greater than the display panel 10 and cover (e.g., entirely cover) the display panel 10 in a plan view. The window 20 may protrude from the edge (or outer edges) of the display panel 10. For example, the window 20 may protrude from the edge (or the outer edges) of the display panel 10 by about 1 mm to about 2 mm, but is not limited thereto. The window 20 may be made of a rigid or a flexible material. The window 20 may be made of at least one of, for example, glass, sapphire, and plastic. However, the disclosure is not limited thereto. The window 20 may be attached to the display panel 10 by an optically clear adhesive (OCA) or the like.

The window 20 may include the black matrix BM and the angular filter AF formed in an area overlapping (in a view or direction) the non-active region NAR. The black matrix BM and the angular filter AF may be disposed from the outer boundary (or the outer side) of the active region AAR to the edge of the window 20, but the disclosure is not limited thereto. For example, the black matrix BM and the angular filter AF may be disposed between the outer boundary of the active region AAR and the edge of the window 20. The black matrix BM and the angular filter AF may each include color ink or black ink. Since the black matrix BM and the angular filter AF may block light such as visible light, the non-active region NAR may not be viewed in a plan view.

FIG. 1 illustrates the black matrix BM as occupying most of the area of the edge of the window 20 and the angular filter AF as occupying a partial area among the edge of the window 20. The angular filter AF may be formed in the region in which the protrusion pattern PP is located and cover the protrusion pattern PP of the display panel 10. Accordingly, the protrusion pattern PP may be covered by the angular filter AF and the rest of the region of the display panel 10 may be covered by the black matrix BM. For example, the black matrix BM may cover the non-active region NAR of the main region MR and the sub-region SR of the display panel 10. The embodiment of the disclosure is not limited thereto, and the angular filter AF may cover (or occupy) an entire edge of the window 20.

Figure 3:
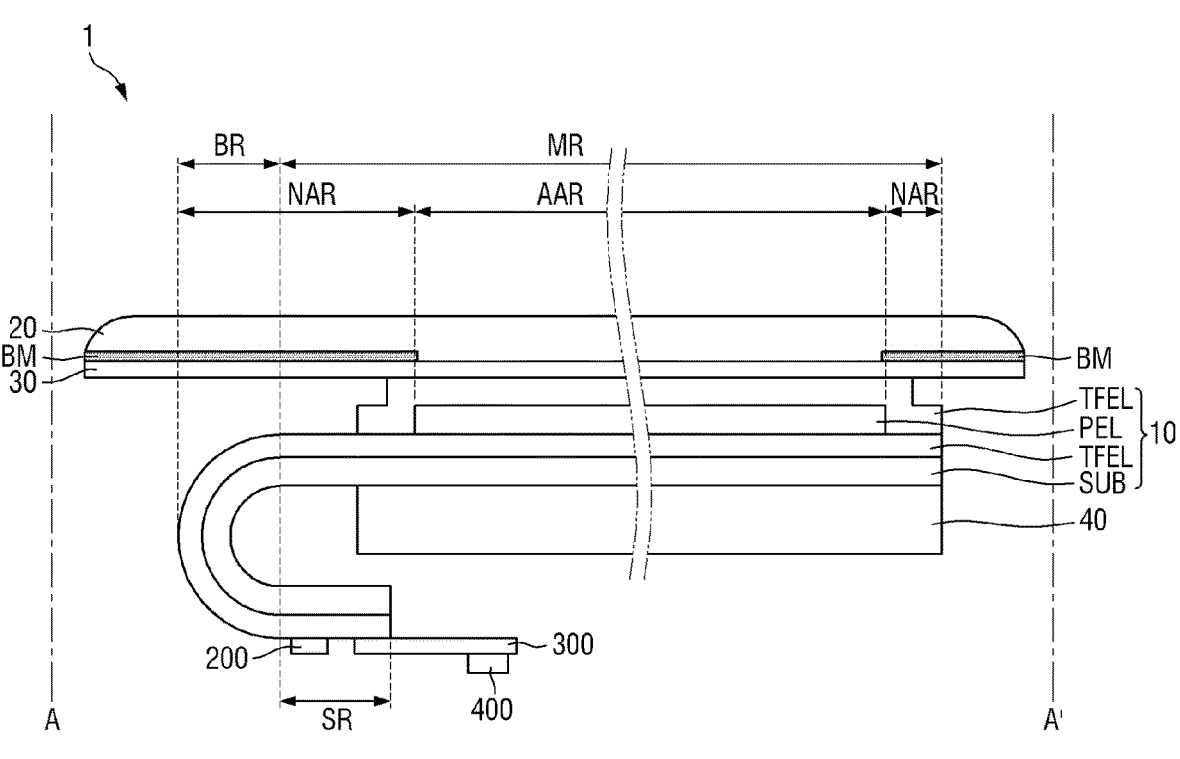
FIG. 3 is a schematic cross-sectional view taken along line A-A' of FIG. 2.
Figure 3:
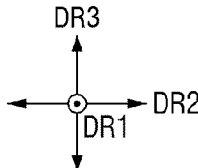

FIG. 3 is a schematic cross-sectional view taken along line A-A' of FIG. 2.

Referring to FIG. 3, the display panel 10 may have a flexible property and a part of the region (e.g., the bending region BR of the display panel 10) may be bent. For example, the sub-region SR of the display panel 10, in which the display driving circuit 200 and the circuit board 300 are attached, may be bent toward a rear side of the display device 1 through the bending region BR. For example, the bending region BR of the display panel 10 may be bent, and the sub-region SR of the display panel 10 may be transported toward the rear side of the display device 1. The sub-region SR of the bent display panel 10 may overlap the main region MR in the thickness direction but is not limited thereto.

The display panel 10 may include a substrate SUB, a thin film transistor layer TFTL disposed on the substrate SUB, a light element layer PEL, and an encapsulation layer TFEL.

The substrate SUB may be a rigid substrate or a flexible substrate that may be bent, folded or rolled. The substrate SUB may be formed of an insulating material such as glass, quartz, or a polymer resin.

The thin film transistor layer TFTL disposed on the substrate SUB may include thin film transistors driving a pixel (e.g., the pixel PX of FIG. 4) and a light sensor (e.g., the light sensor PS of FIG. 4), display signal lines and read-out lines. The display signal lines may include a scan line which supplies (or applies or delivers) a scan signal and a data line which supplies (or delivers) a data signal to the each pixel. The read-out lines may supply (or deliver) a sensing current generated from each light sensor to the read-out circuit 400.

The light element layer PEL disposed on a surface of the thin film transistor layer TFTL may be disposed in the active region AAR and include light emitting elements LEL (e.g., refer to FIG. 10) of each pixel PX emitting light and photoelectric conversion devices PD (e.g., refer to FIG. 10) of the light sensor PS.

Each of the light emitting elements LEL may emit light with a luminance (e.g., a predetermined or selectable luminance) according to an anode voltage and a cathode voltage received from the thin film transistor layer TFTL. Each of the photoelectric conversion devices PD may generate photocharges as a luminance of incident light increases. For example, the photoelectric conversion device PD may generate the photocharges in proportion to the amount of incident light. The light incident on the photoelectric conversion device PD may be light of an infrared wavelength band. The accumulated photocharges may be converted into an electrical signal required for sensing according to the anode voltage and the cathode voltage of the photoelectric conversion device PD applied from the thin film transistor layer TFTL.

The encapsulation layer TFEL may be disposed on a top of the light element layer PEL. The encapsulation layer TFEL may include a stacked layer of inorganic layers or organic layers and prevent moisture or oxygen from permeating the light emitting elements LEL of the light element layer PEL.

In some embodiments, the display device 1 may include the window 20, a transparent coupling member 30, the black matrix BM, and a panel bottom member 40. The window 20 may be disposed on top of the display panel 10. The transparent coupling member 30 may be disposed between the window 20 and the display panel 10 and couple (or connect) the window 20 to the display panel 10. The black matrix BM may be attached to the edge of the window 20. The panel bottom member 40 may be disposed on the bottom of the display panel 10.

As described above, the window 20 may cover the top (or top surface) of the display panel 10. The window 20 may have a size greater than the display panel 10 and cover (e.g., entirely cover) the display panel 10. The window 20 may protrude from the display panel 10. The window 20 may include the black matrix BM. The black matrix BM may be adjacent to sides (e.g., surround every sides) of the active region AAR, entirely cover the non-active region NAR, and be disposed to the a region of the edge of the window 20. For example, the black matrix BM may be disposed between the sides of the active region AAR and the edge of the window 20.

The transparent coupling member 30 may be disposed between the window 20 and display panel 10 and couple the window 20 and display panel 10. The transparent coupling member 30 may include an optical clear adhesive (OCA) or an optical transparent resin (OCR). The transparent coupling member 30 may overlap (e.g., entirely overlap) the window 20 in a plan view.

The panel bottom member 40 may be disposed on the bottom of the display panel 10. The panel bottom member 40 may perform at least one of a heat dissipation function, an electromagnetic wave shielding function, and a grounding function. The panel bottom member 40 may include at least one functional layer that serves at least one function of the functions described above. The functional layer of the panel bottom member 40 may be provided in various forms such as a layer, a film, a sheet, or the like. The panel bottom member 40, for example, may include at least one of a heat dissipation sheet, an electromagnetic shielding sheet, and a grounding sheet.

Although not illustrated, a mold frame (or a bracket) accommodating the display panel 10 and the panel bottom member 40 may be further disposed on a bottom of the panel bottom member 40. The mold frame may be bonded to the window 20 or the transparent coupling member 30.

Figure 4:
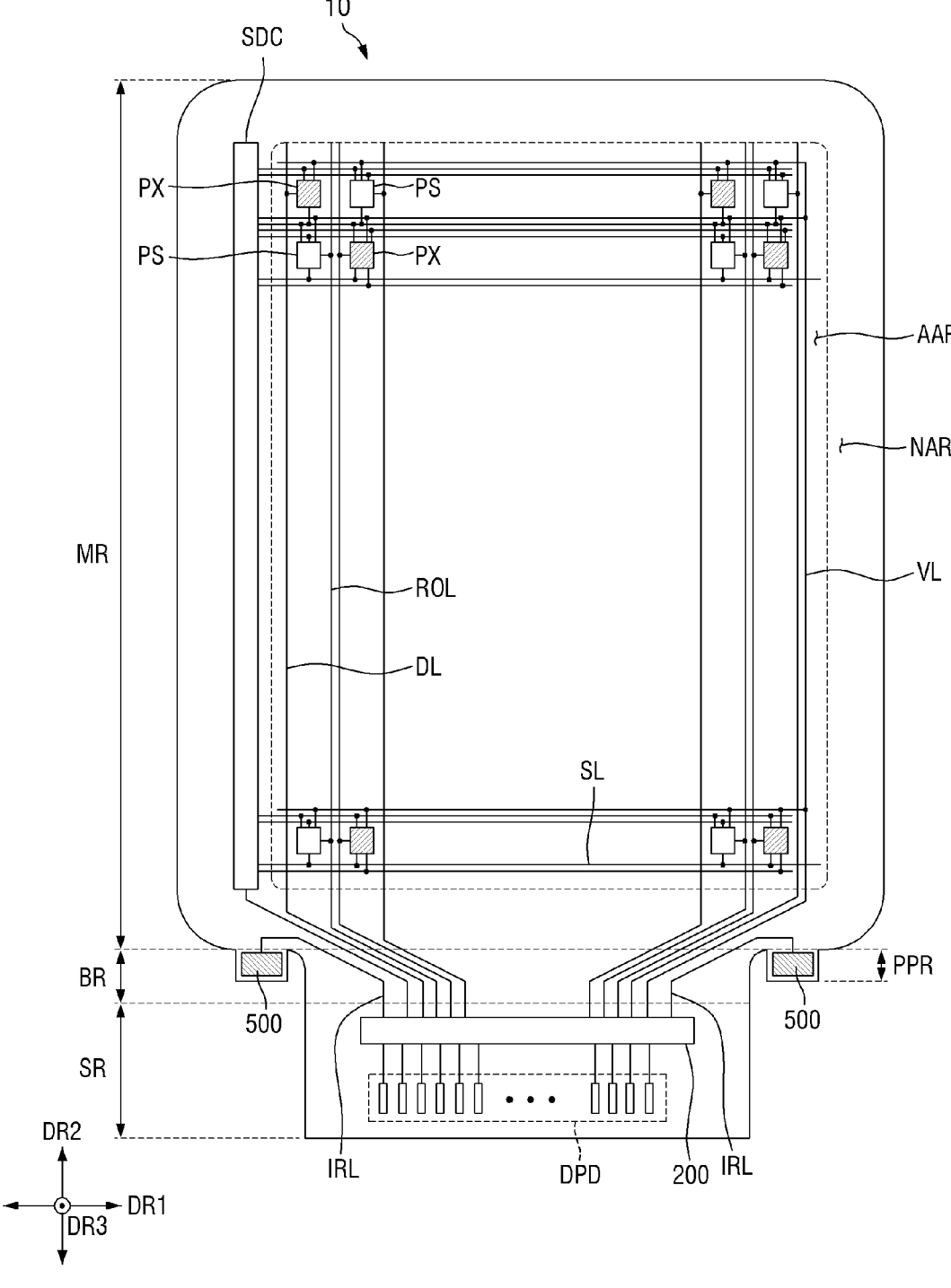
FIG. 4 is a schematic plan view showing a pixel, a light sensor, and a light source part of a display panel according to an embodiment.
Figure 5:
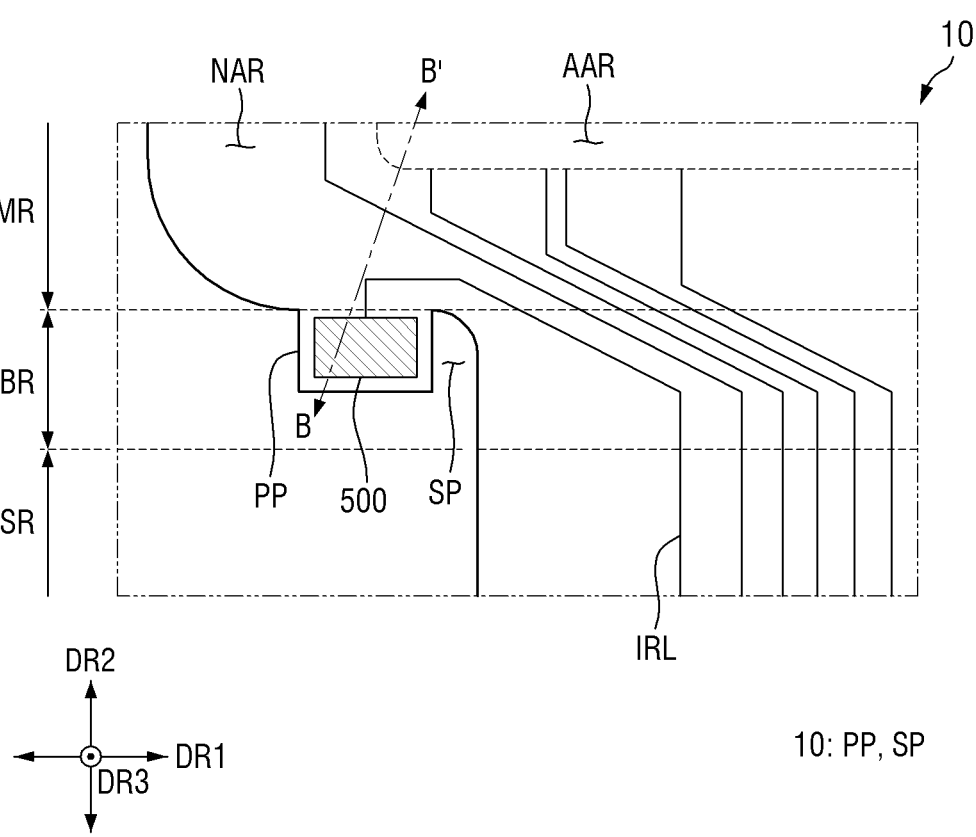
FIG. 5 is a schematic enlarged plan view of a bottom end of a display panel according to an embodiment.

FIG. 4 is a schematic plan view showing a pixel, a light sensor, and a light source part of a display panel according to an embodiment. FIG. 5 is a schematic enlarged plan view of a bottom end of a display panel according to an embodiment.

Referring to FIGS. 4 and 5, the pixels PX and the light sensors PS may be disposed in the active region AAR of the display panel 10 and multiple light source parts 500 may be disposed in the non-active region NAR of the display panel 10.

Scan lines SL, power voltage lines VL, data lines DL, and read-out lines ROL may further be disposed in the active region AAR of the display panel 10. The scan lines SL and the power voltage lines VL may be connected to the pixels PX and the light sensors PS. The data lines DL may be connected to the pixels PX. The read-out lines ROL may be connected to the light sensors PS.

Each scan line SL may supply a scan signal received from a scan driver SDC to the pixels PX and the light sensors PS. The scan lines SL may extend in the first direction DR1 and be spaced apart from each other in the second direction DR2.

The data line DL may supply a data voltage received from the display driving circuit 200 to the pixels PX. The data line DL may extend in the second direction DR2 and be spaced apart from each other in the first direction DR1. A data voltage may be supplied to the pixels PX through the data line DL and determine the luminance of the pixels PX.

The power voltage line VL may supply a power voltage received from the display driving circuit 200 to the pixels PX and the light sensors PS. The power voltage may be a driving power voltage ELVDD and/or a common voltage ELVSS of FIG. 10. The driving power voltage ELVDD may be a high-level voltage to drive the light emitting element LEL and the photoelectric conversion device PD. The common voltage ELVSS may be a low-level voltage that drives the light emitting element LEL and the photoelectric conversion device PD. The power voltage line VL may extend in the second direction DR2 from the active region AAR, be spaced apart from each other in the first direction DR1, and be electrically connected to each other in the non-active region NAR.

Each read-out line ROL may supply the sensing current generated in the light sensor PS according to an external light to a read-out circuit 400 (e.g., refer to FIG. 1). The read-out line ROL may extend in the second direction DR2 and be spaced apart from each other in the first direction DR1. The read-out circuit 400 may be electrically connected to the light sensors PS through the read-out line ROL, and generate a fingerprint sensing data according to the volume of the current sensed in each light sensor PS to transmit to a main processor.

The scan driver SDC, the light source part 500, and light source voltage lines IRL connected to the light source parts 500 may be disposed in the non-active region NAR of the display panel 10. The display panel 10 may further include a slit portion SP.

The scan driver SDC may be disposed on a side (i.e., left side) of the active region AAR, but is not limited thereto. The scan driver SDC may receive a scan control signal from the display driving circuit 200 and generate scan signals to output the scan signals to the scan lines SL.

The light source part 500 may emit light (e.g., predetermined or selectable light). For example, the light source part 500 may emit light of infrared wavelength band according to a light source voltage applied to the light source voltage line IRL. The light emitted from the light source part 500 may be a light source to sense the fingerprint F by the light sensor PS. The light source part 500 may have an LED chip including a first electrode, a light emitting layer, and a second electrode.

The light source part 500 may be mounted in the protrusion pattern PP of the display panel 10 and overlap the protrusion pattern PP in the third direction DR3. For example, the protrusion pattern region PPR where the protrusion pattern PP is disposed may include the light source part 500. The light source part 500 may protrude from the main region MR toward the another side in the second direction DR2. For example, the light source part 500 may protrude from the side of the main region MR in an opposite direction to the second direction DR2. The light source part 500 may be disposed on the side and/or the another side in the first direction DR1 on the bottom of the display panel 10. For example, two light source parts 500 may be disposed on two portions of the bottom of the display panel 10. The light source parts 500 may be disposed on both sides of the bending region BR with respect to the bending region BR. For example, the light source parts 500 may be formed on the side and the another side in the first direction DR1 with respect to the bending region BR. For example, the bending region BR may be spaced apart from each other, and the bending region BR may be disposed between the light source parts 500.

The light source part 500 may be spaced apart from the bending region BR of the display panel 10 in the first direction DR1 and may be parallel to each other. Referring to FIG. 5, a slit portion SP may be formed between the protrusion pattern PP and the bending region BR. The slit portion SP may separate the protrusion pattern PP and the bending region BR. The protrusion pattern PP may extend from the main region MR. The protrusion pattern PP may not contact the bending region BR and may be separated from the bending region BR by the slit portion SP. The bending region BR may extend from the main region MR. The bending region BR may not contact the protrusion pattern PP and may be separated from the protrusion pattern PP by the slit portion SP. The bending region BR, the slit portion SP, and the protrusion pattern PP may be formed to be parallel in the first direction DR1. The bending region BR, the slit portion SP, and the light source part 500 may also be formed to be parallel in the first direction DR1.

Although the disclosure is not limited to the following embodiment, since the light source part 500 is disposed on the protrusion pattern PP, the light source part 500 may not be disposed on the side of the main region MR in the second direction DR2, the side of the main region MR in the first direction DR1, or the another side of the main region MR in the first direction DR1. For example, the light source part 500 may not be disposed on the top, left, or right side of the display panel 10 in the drawings.

Each light source voltage lines IRL may supply the light source voltage received from the display driving circuit 200 to the light source part 500. In some embodiments, the light source voltage line IRL may extend from the display driving circuit 200 in the second direction DR2 and be partially bent in the first direction DR1. Since the light source part 500 is separated from the bending region BR by the slit portion SP, the light source voltage line IRL may bypass the left or right edge of the bottom portion of the display panel 10 from the part where the slit portion SP is formed. Thus, the light source voltage line IRL may be electrically connected to the light source unit 500. Although the disclosure is not limited to the following embodiment, the light source voltage line IRL may be electrically connected to a first lead frame 541 (e.g., refer to FIG. 7) or a second lead frame 542 (e.g., refer to FIG. 7) to apply the light source voltage to the light source part 500.

The non-active region NAR of the display panel 10 may include the pad portion DPD including pads. The pad portion DPD may be disposed in the sub-region SR and electrically connected to the circuit board 300.

In accordance with the display device 1 according to the embodiment, the display panel 10 may include the main region MR, the bending region BR, the sub-region SR, and the protrusion pattern PP. The protrusion pattern PP may protrude from the main region MR may be parallel to the bending region BR and spaced apart from the bending region BR. The display device 1 may sense the fingerprint of the user as the protrusion pattern PP includes the light source part 500 which functions as the light source of the light sensor PS. Since the display panel 10 includes the protrusion pattern PP, the light source part 500 may be formed in the display panel 10 without configuring a separate circuit substrate other than the display panel 10 for mounting the light source part 500. Therefore, space utilization of the display panel 10 may be maximized and size of the display device 1 may be decreased.

Also, in an embodiment, since the display device 1 includes a slit portion SP that separates the protrusion pattern PP and the bending region BR, it is possible to prevent the light source part 500 mounted on the protrusion pattern PP from being affected when the display panel 10 is bent in the bending region BR. Because the protrusion pattern PP and the bending region BR is separated by the slit portion SP, the protrusion pattern PP and the light source part 500 may not be damaged even when the display panel 10 is bent.

Figure 6:
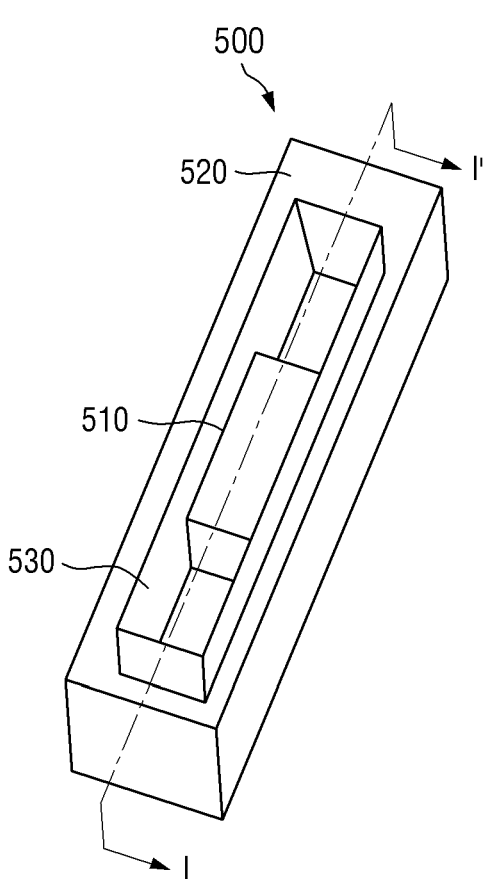
FIG. 6 is a schematic perspective view showing a light source part.
Figure 7:
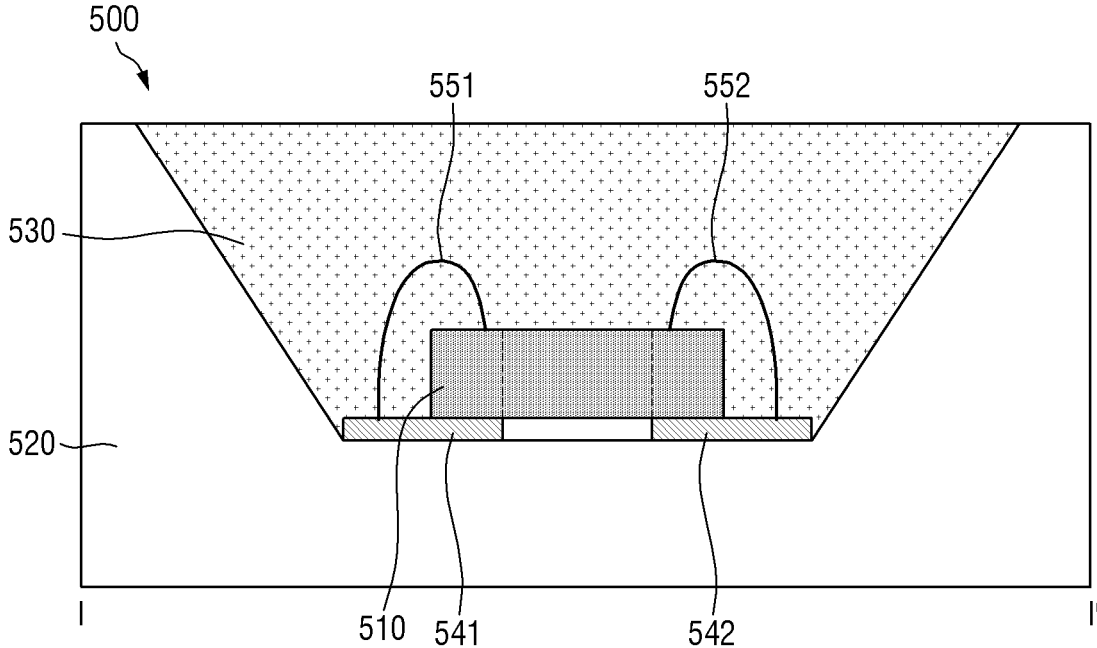
FIG. 7 is a schematic cross-sectional view of a light source part taken along line I-I' of FIG. 6.

FIG. 6 is a schematic perspective view showing a light source part. FIG. 7 is a schematic cross-sectional view of a light source part taken along line I-I' of FIG. 6.

An example structure of the light source part 500 disposed on the protrusion pattern PP will be described with respect to FIGS. 6 and 7.

The light source part 500 may include a light emitting chip 510, a reflector 520, and a transparent molding 530. The light source part 500 may further include a first lead frame 541, a second lead frame 542, a first wire 551, and a second wire 552.

The reflector 520 may be adjacent to (e.g., surround) the light emitting chip 510. The reflector 520 may be formed on sides (e.g., four sides) of the light emitting chip 510. The reflector 520 may provide a space in which the light emitting chip 510 is mounted and reflect light emitted from the light emitting chip 510.

The light emitting chip 510 may be disposed in the reflector 520. For example, the light emitting chip 510 may be disposed in a space of the reflector 520. The light emitting chip 510 may be a light emitting diode (LED) emitting infrared light. The light source part 500 may emit light by the light emitted from the light emitting chip 510. The light emitting chip 510 may include a first electrode, a light emitting layer, and a second electrode. For example, the first electrode of the light emitting chip 510 may be located on an end of the light emitting chip 510, and the second electrode of the light emitting chip 510 may be located on another end of the light emitting chip 510. The first electrode, the light emitting layer, and the second electrode of the light emitting chip 510 may be aligned in a direction.

The transparent molding 530 may cover the reflector 520 and the light emitting chip 510. The transparent molding 530 may cover a side portion of the reflector 520 and top and side portions of the light emitting chip 510. Polymer material may be used for transparent molding 530, but the disclosure is not limited thereto.

The first lead frame 541 and the second lead frame 542 may be spaced apart from each other. Each of the first lead frame 541 and the second lead frame 542 may receive a light source voltage to drive the light emitting chip 510 from the light source voltage line IRL. The first lead frame 541 may receive power of a first polarity and the second lead frame 542 may receive power of a second polarity different from the first polarity. For example, when the power of the first polarity is an anode power, the power of the second polarity may be a cathode power. In other embodiments, the power of the first polarity may be a cathode electrode and the power of the second electrode may be an anode power. The first lead frame 541 and the second lead frame 542 may be metal electrodes. The light emitting chip 510 may be mounted directly on the first lead frame 541 and the second lead frame 542. For example, the first lead frame 541 may be in contact with the first electrode located on an end portion of the light emitting chip 510, and the second lead frame 542 may be in contact with the second electrode of the light emitting chip 510, but the disclosure is not limited thereto.

The first wire 551 may connect the first lead frame 541 to the light emitting chip 510, and the second wire 552 may connect the second lead frame 542 to the light emitting chip 510.

However, the structure of the light source part 500 according to the embodiment is not limited thereto. In some embodiments, at least one of (or all of) the reflector 520, the transparent molding 530, the first lead frame 541, the second lead frame 542, the first wire 551, and the second wire 552 may be omitted.

Figure 8:
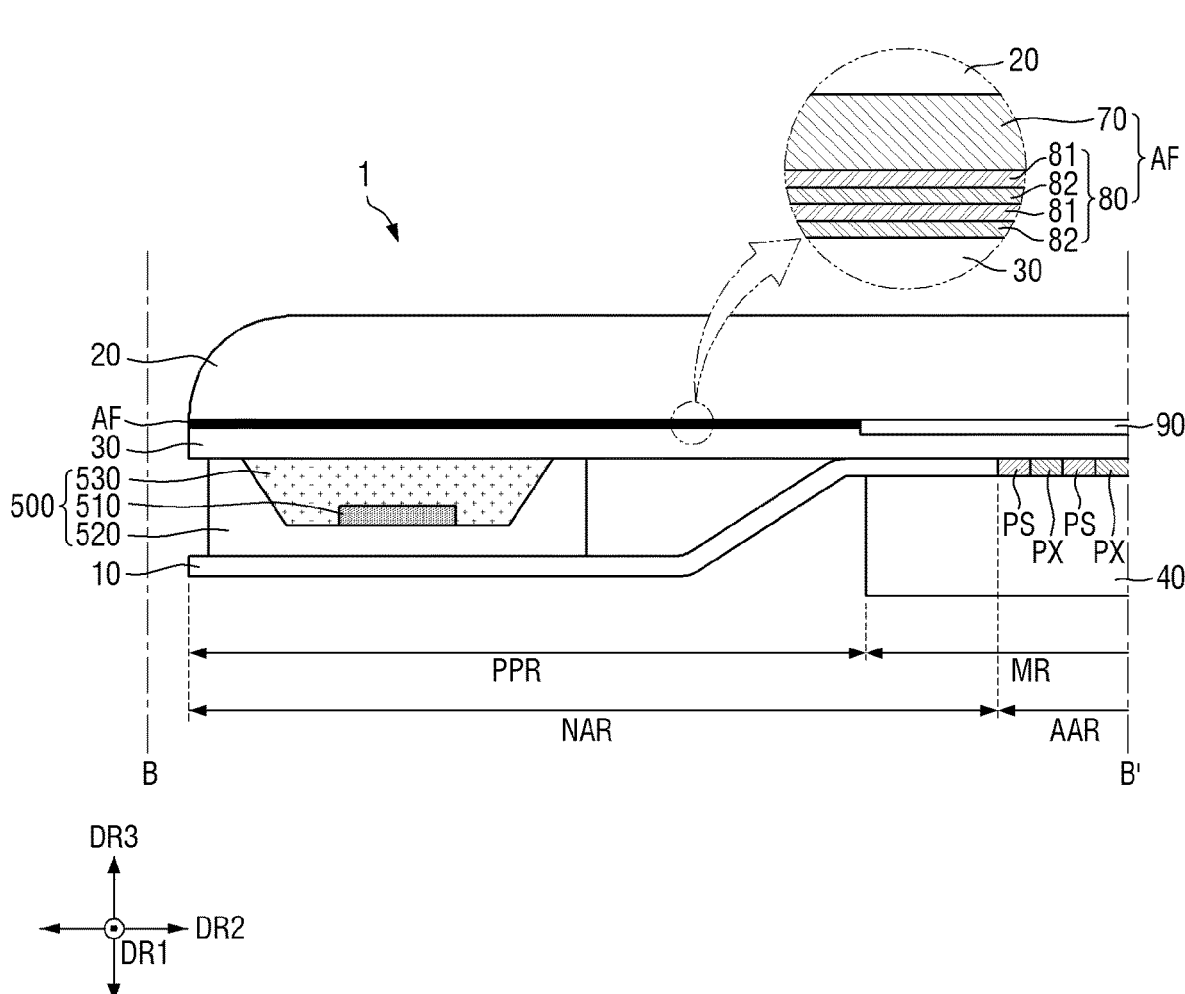
FIG. 8 is a schematic cross-sectional view taken along line B-B' of FIG. 5.

FIG. 8 is a schematic cross-sectional view taken along line B-B' of FIG. 5.

FIG. 8 illustrates a part of the main region MR of the display panel 10 and the protrusion pattern region PPR in which a protrusion pattern PP is located. The pixels PX and the light sensors PS may be disposed in the active region AAR as a part of the main region MR. The light source part 500 may be mounted on the protrusion pattern PP. The transparent coupling member 30 may be disposed on the display panel 10 including the light source part 500, and the window 20 may be disposed on the transparent coupling member 30. A low refractive coating layer 90 or the angular filter AF may be disposed between the transparent coupling member 30 and the window 20, and the low refractive coating layer 90 may be disposed in the main region MR. The angular filter AF may be disposed in the protrusion pattern region PPR.

The pixels PX and the light sensors PS may be disposed in the active region AAR which is the part (or portion) of the main region MR. The pixels PX and the light sensors PS may be alternately disposed in a direction, but the disclosure is not limited thereto. The panel bottom member 40 may be disposed on the bottom of the display panel 10 in the main region MR.

The protrusion pattern PP may include a first region inclined downward with respect to a cross-section of the panel bottom member 40 and a second region in which the light source part 500 is mounted. The protrusion pattern PP may extend parallel to the display panel 10 in the active region AAR in the second region, but is not limited thereto.

The light source part 500 may be disposed in the protrusion pattern region PPR. The light source part 500 may be mounted on the protrusion pattern PP. The light emitted from the light emitting chip 510 of the light source part 500 may pass through the transparent coupling member 30 and the angular filter AF to reach a top surface of the window 20.

The transparent coupling member 30 may be disposed on the light source part 500 and the display panel 10. The light source part 500 may be in direct contact with the window 20 through the transparent coupling member 30, but the disclosure is not limited thereto. The display panel 10 and the window 20 may be in direct contact through the transparent coupling member 30.

The window 20 may be disposed on the transparent coupling member 30 and may include the angular filter AF and the low refractive coating layer 90. The angular filter AF may be disposed on the light source part 500 in the protrusion pattern region PPR, and the low refractive coating layer 90 may be disposed on the display panel 10 in the main region MR.

The angular filter AF may overlap the light source part 500 in a plan view. The angular filter AF may absorb visible light and transmit infrared light. Since the angular filter AF has a visible light transmittance of less than about 0.1%, the angular filter AF may function as the black matrix. The light transmittance of the light emitted from the light source part 500 may be adjusted according to an emission angle of the infrared light emitted from the light source part 500 by the angular filter AF.

The angular filter AF may include an ink layer 70 and an optical multilayer 80. The ink layer 70 of the angular filter AF may be disposed on a rear surface of the window 20, and the optical multilayer 80 of the angular filter AF may be disposed on a rear surface of the ink layer 70. The light source part 500, the transparent coupling member 30, the optical multilayer 80, the ink layer 70, and the window 20 may be disposed in the third direction DR3. The ink layer 70 may include black ink that absorbs visible light and emits infrared light similar to the black matrix.

The optical multilayer 80 may have multiple layers in which low refractive layers 81 and high refractive layers 82 are alternately disposed. A refractive rate of each of the low refractive layers 81 may be greater than a refractive rate of each of the high refractive layers 82. The optical multilayer 80 may adjust the light transmittance according to the emission angle of the infrared light emitted from the light source part 500. Since the low refractive layers 81 and the high refractive layers 82 are alternately disposed, reflection or transmission of light may occur at interfaces between the low refractive layers 81 and the high refractive layers 82. Since path lengths of lights are different from each other, the light transmittance of the light incident into the optical multilayer 80 may be adjusted. For example, the light may be totally reflected from the optical multilayer 80. Accordingly, the light source part 500 may provide the totally reflected light to the window 20 through the optical multilayer 80. The light source part 500 may also provide diffusely reflected lights back to the light source part 500.

The low refractive coating layer 90 may be disposed on the display panel 10 in the main region MR. The low refractive coating layer 90 may be attached to the display panel 10 and guide the light toward the display panel 10.

Although the disclosure is not limited to the following embodiments, the angular filter AF of the window 20, the black matrix BM (e.g., refer to FIG. 3), and the low refractive coating layer 90 may be disposed in the rear surface of the window 20. For example, the angular filter AF may be disposed in the first region of the protrusion pattern PP overlapping the light source part 500 among the non-active region NAR of the display panel 10 in a plan view. The black matrix BM may be disposed in the second region of the protrusion pattern PP, which does not overlap the light source part 500, among the non-active region NAR of the display panel 10 in a plan view. The low refractive coating layer 90 may overlap the active region AAR in a plan view.

Figure 9:
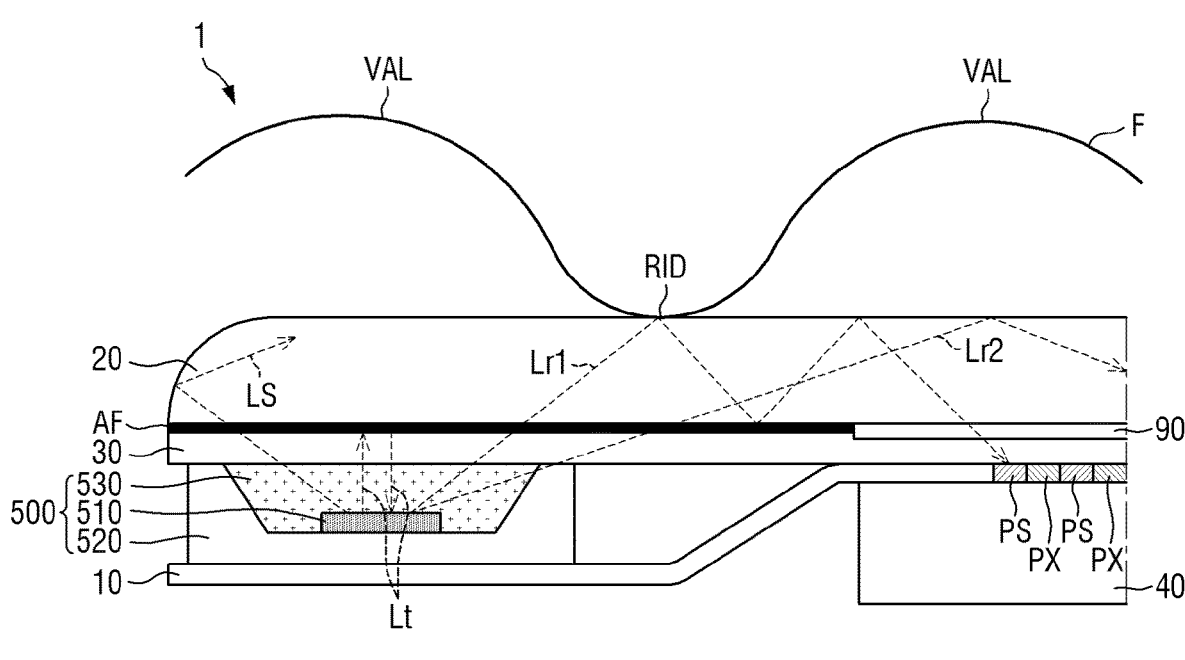
FIG. 9 is a schematic diagram illustrating light emitted from a light source part of FIG. 8.
Figure 9:
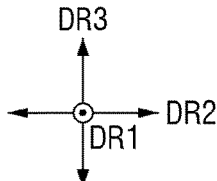

FIG. 9 is a schematic diagram illustrating light emitted from a light source part.

Referring to FIG. 9, the drawing is a cross-sectional view illustrating a state in which the user's finger is in contact with the top of the window 20 of the display device 1, and a fingerprint F may be formed of valleys VAL between ridges RID having a pattern.

Some lights Lr1 and Lr2 among lights LR1, Lr2, Ls, and Lt output from the light source part 500 may travel to the upper surface of the window 20 in a direction and pass through the angular filter AF. The lights Lr1 and Lr2 traveling to the upper surface of the window 20 may be reflected on the upper surface of the window 20.

The lights Lr1 and Lr2 reflected from the upper surface of the window 20 may be reflected by the valleys VAL and the ridges RID. The ridges RID of the fingerprint F may be in contact with the upper surface of the window 20, and the valleys VAL of the fingerprint F may not be in contact with the window 20. A first light Lr1 may be reflected from the ridge RID of the fingerprint F, and a second light Lr2 may be reflected from the valley VAL of the fingerprint F. Accordingly, an amount of the first light Lr1 and an amount of the second light Lr2 may be different. For example, the first light Lr1 may be diffusely reflected on the upper surface of the window 20 by contacting the ridge RID. For example, the first light Lr1 may be diffusely reflected on an interface between the window 20 and the ridge RID. The second light Lr2 may be totally reflected on the upper surface of the window 20. For example, the second light Lr2 may be totally reflected on an interface between the window 20 and an air. The reflected first light Lr1 and the reflected second light Lr2 may be incident on the light sensor PS, and the ridges RID and the valleys VAL of the fingerprint F may be derived (or sensed) based on a difference in the amount of the light incident on the light sensor PS. Since the light sensor PS outputs the electrical signal (i.e., light current) according to the difference of the amount of light, the fingerprint F pattern of the finger may be identified.

Some of the light Lt among the lights Lr1, Lr2, Ls, and Lt output from the light source part 500 may be reflected by the angular filter AF and may be incident on the light source part 500 again. The angular filter AF may reflect the total reflection light. In other embodiments, the angular filter AF may reflect light other than the total reflection light. Some of the light Ls among the lights Lr1, Lr2, Ls, and Lt output from the light source part 500 may travel to the side surface of the window 20. The light Ls may travel again to the active region AAR due to a side surface reflection coating (not illustrated) disposed on the side surface of the window 20. The side surface reflection coating (not illustrated) may be used as a total reflection. Thus, a signal intensity of the light sensor PS may be increased.

As described above, the light source part 500 may be mounted on the protrusion pattern PP of the lower end of the display panel 10 and provide the light to the display panel 10 in which the pixels PX and the light sensors PS are integrated. Thus, the user's fingerprint F may be identified.

Figure 10:
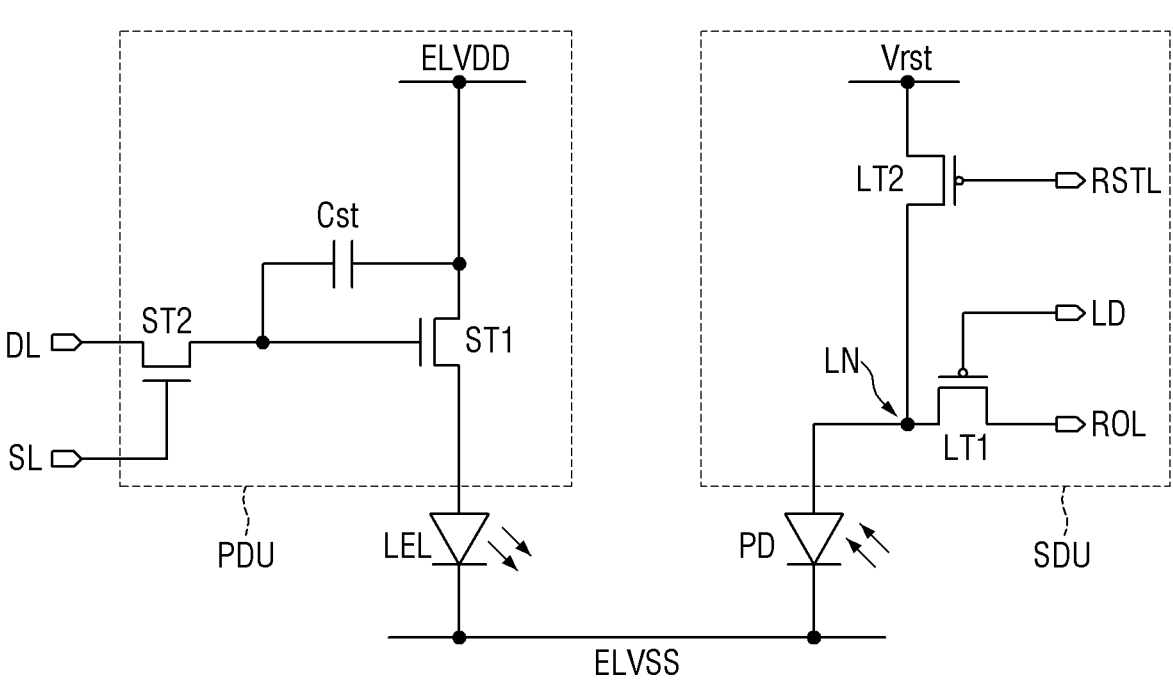
FIG. 10 is a schematic diagram of an equivalent circuit illustrating a pixel and a light sensor of a display panel according to an embodiment.

FIG. 10 is a schematic diagram of an equivalent circuit illustrating a pixel and a light sensor of a display panel according to an embodiment.

Referring to FIG. 10, the pixel PX may include a light emitting element LEL and a pixel driver PDU controlling the amount of the light emitted from the light emitting element LEL. The pixel driver PDU may include a capacitor Cst, a first transistor ST1, and a second transistor ST2. The pixel driver PDU may receive a data signal from the data line DL, a scan signal from the scan line SL, a first power voltage ELVDD, and a second power voltage ELVSS.

The light emitting element LEL may be an organic light emitting diode including an organic light emitting layer disposed between an anode electrode and a cathode electrode. In an embodiment, the light emitting element LEL may be a quantum dot light emitting element including a quantum dot light emitting layer disposed between the anode electrode and the cathode electrode. In some embodiments, the light emitting element LEL may be an inorganic light emitting element including an inorganic semiconductor disposed between an anode electrode and a cathode electrode. In case that the light emitting element LEL is an inorganic light emitting element, the light emitting element LEL may include (or may be) a micro light emitting diode or a nano light emitting diode.

Figure 11:
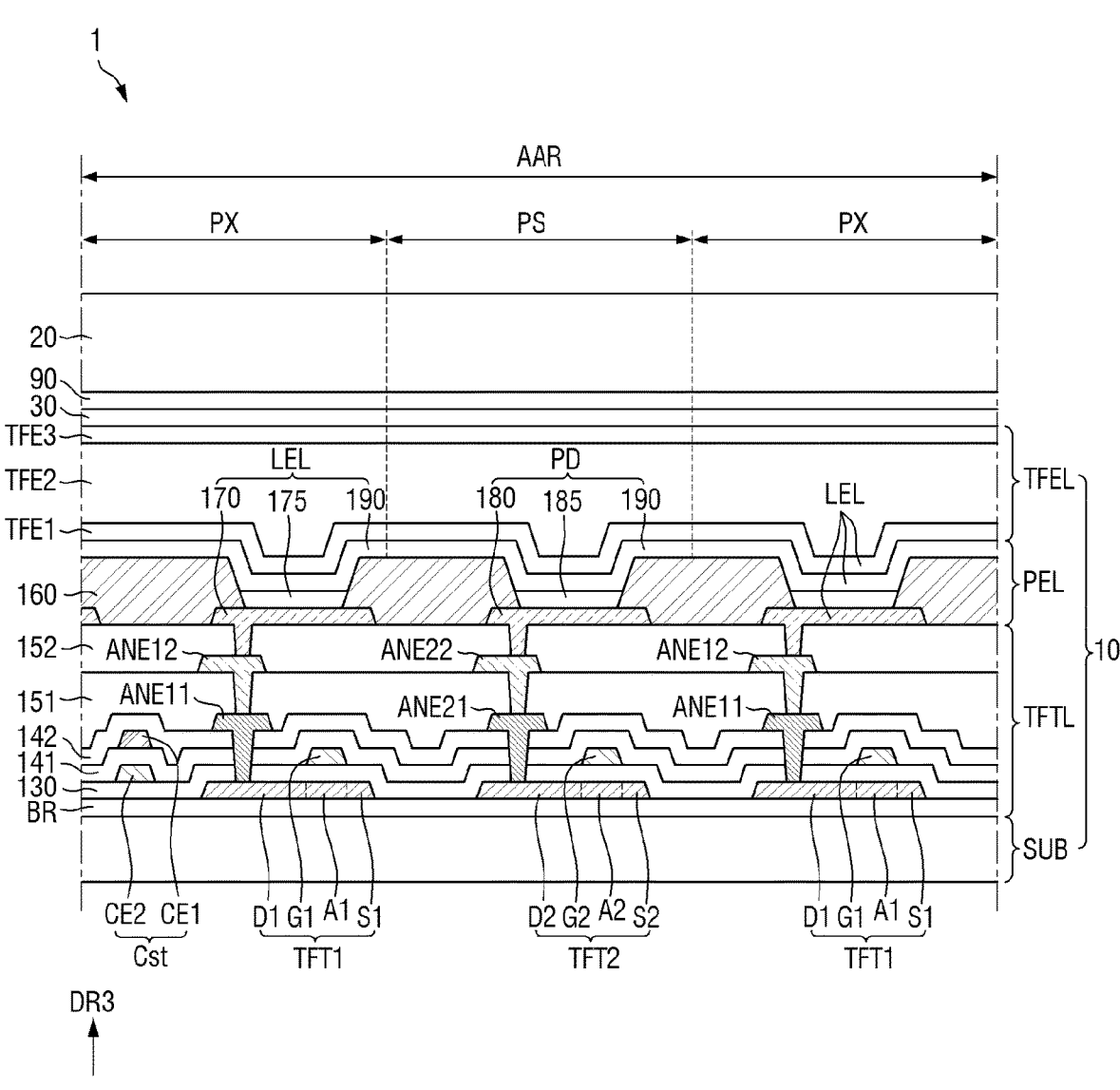
FIG. 11 is a schematic cross-sectional view of a pixel and a light sensor in an active region according to an embodiment.

The light emitting element LEL may emit light of a luminance (e.g., a predetermined or selectable luminance) according to the anode voltage and the cathode voltage. The anode electrode of the light emitting element LEL may be connected to the first transistor ST1, and the cathode electrode may be connected to a terminal of the second power voltage ELVSS. In FIG. 11, the anode electrode of the light emitting element LEL may correspond to a pixel electrode 170, and the cathode electrode of the light emitting element LEL may correspond to a common electrode 190.

The capacitor Cst may be connected between a gate electrode of the first transistor ST1 and a terminal of the first power voltage ELVDD. The capacitor Cst may include a first capacitor electrode CE1 (e.g., refer to FIG. 11) connected to the gate electrode of the first transistor ST1 and a second capacitor electrode CE2 (e.g., refer to FIG. 11) connected to the terminal of the first power voltage ELVDD. The capacitor Cst may be charged with a voltage corresponding to the data signal received from the second transistor ST2.

The first transistor ST1 may be a driving transistor, and the second transistor ST2 may be a switching transistor. Each transistor may include a gate electrode, a source electrode, and a drain electrode. For convenience of explanation, one of the source electrode and the drain electrode may be an electrode, and another of the source electrode and the drain electrode may be another electrode. Hereinafter, a case in which the drain electrode is an electrode and the source electrode is another electrode is discussed as an example for convenience of description.

The first transistor ST1 may be a driving transistor and may generate a driving current. The gate electrode of the first transistor ST1 may be connected to a first capacitor electrode. The electrode of the first transistor ST1 may be connected to the terminal of the first power voltage ELVDD and a second capacitor electrode. The another electrode of the first transistor ST1 may be connected to the anode electrode of the light emitting element LEL. The first transistor ST1 may control the driving current flowing through the light emitting element LEL in response to the amount of charge stored in the capacitor Cst.

The second transistor ST2 may be a switching transistor. The gate electrode of the second transistor ST2 may be connected to the scan line SL. The electrode of the second transistor ST2 may be connected to the data line DL. The another electrode of the second transistor ST2 may be connected to the electrode of the first transistor ST1. The second transistor ST2 may be turned on according to the scan signal of the scan line SL and perform a switching operation of transferring the data signal to the electrode of the first transistor ST1.

However, this is only an example, and the pixel driver PDU may have a 3T1C or 7T1C structure that further includes a compensation circuit for compensating for the threshold voltage deviation ΔVth of the first transistor ST1.

Each of the light sensors PS may include a photoelectric conversion device PD and a sensing driver SDU that controls a sensing current according to a photocurrent of the photoelectric conversion device PD. The sensing driver SDU may include a sensing transistor LT1 and a reset transistor LT2. The sensing transistor LT1 may control a sensing current generated from the photoelectric conversion device PD. The sensing driver SDU may receive a reset signal from a reset signal line RSTL, a fingerprint scan signal from a fingerprint scan line LD, the second power voltage ELVSS, and a reset voltage Vrst. The sensing driver SDU may be connected to the read-out line ROL. The fingerprint scan line LD may be shared with the scan line SL connected to a pixel driver PDU.

Each of the photoelectric conversion devices PD may be a photodiode including a sensing anode electrode, a sensing cathode electrode, and a photoelectric conversion layer disposed between the sensing anode electrode and the sensing cathode electrode. Each of the photoelectric conversion devices PD may convert externally incident light into an electrical signal. The photoelectric conversion device PD may be a phototransistor or an inorganic photodiode formed of a pn-type or pin-type inorganic material. As another example, the photoelectric conversion device PD may be an organic photodiode including an electron donating material generating donor ions and an electron accepting material generating acceptor ions.

The sensing anode electrode of the photoelectric conversion device PD may be electrically connected to a sensing node LN. The sensing cathode electrode of the photoelectric conversion device PD may be electrically connected to the terminal of the second power voltage ELVSS to receive the second power voltage ELVSS. The sensing anode electrode of the photoelectric conversion device PD may correspond to a sensing electrode 180 (e.g., refer to FIG. 11). The sensing cathode electrode may correspond to the common electrode 190 (e.g., refer to FIG. 11).

In case that the photoelectric conversion device PD is exposed to external light, photocharges may be generated, and the generated photocharges may be accumulated in the sensing anode electrode of the photoelectric conversion device PD. The voltage of the sensing node LN electrically connected to the sensing anode electrode may increase. In case that the photoelectric conversion device PD is electrically connected to the read-out line ROL, the sensing voltage may be applied to the read-out line ROL in proportion to the accumulated voltage of the sensing node LN.

In a sensing transistor LT1, the gate electrode of the sensing transistor LT1 may be connected to the fingerprint scan line LD, an electrode of the sensing transistor LT1 may be connected to the sensing node LN, and another electrode of the sensing transistor LT1 may be connected to the read-out line ROL. The sensing transistor LT1 may be turned on according to the fingerprint scan signal of the fingerprint scan line LD and transfer the current flowing through the photoelectric conversion device PD to the read-out line ROL.

In the reset transistor LT2, the gate electrode of the reset transistor LT2 may be electrically connected to the reset signal line RSTL, an electrode of the reset transistor LT2 may be electrically connected to a terminal of the reset voltage Vrst, and another electrode of the reset transistor LT2 may be electrically connected to the sensing node LN.

The sensing node LN and the sensing anode electrode of the photoelectric conversion device PD may be reset to the reset voltage Vrst.

In the drawings, the case where each transistor is an NMOS or PMOS transistor is illustrated as an example, but the invention is not limited thereto.

FIG. 11 is a schematic cross-sectional view of a pixel and a light sensor in an active region according to an embodiment.

Referring to FIG. 11, a barrier layer BR may be disposed on the substrate SUB. The barrier layer BR may include at least one of silicon nitride, silicon oxide, and silicon oxynitride.

The thin film transistor layer TFTL may be disposed on the barrier layer BR and include a first thin film transistor TFT1 and a second thin film transistor TFT2. The first thin film transistor TFT1 may be the first transistor ST1 of the pixel PX of FIG. 10. The second thin film transistor TFT2 may be the sensing transistor LT1 of the light sensor PS of FIG. 10.

A first active layer of the thin film transistors TFT1 and TFT2 may be disposed on the barrier layer BR. The first active layer of the first thin film transistor TFT1 and the second thin film transistor TFT2 may include at least one of polycrystalline silicon, monocrystalline silicon, low-temperature polycrystalline silicon, amorphous silicon, and an oxide semiconductor. For example, the oxide semiconductor of the first active layer may include at least one of a binary compound (ABx), a ternary compound (ABxCy), and a quaternary compound (ABxCyDz) including at least one of indium, zinc, gallium, tin, titanium, aluminum, hafnium (Hf), zirconium (Zr), magnesium (Mg) and the like.

The first thin film transistor TFT1 may include a first channel region A1, a first drain region D1, a first source region S1, and a first gate electrode G1, and the second thin film transistor TFT2 may include a second channel region A2, a second drain region D2, a second source region S2, and a second gate electrode G2. The first active layer may include channel regions A1 and A2, drain regions D1 and D2, and source regions S1 and S2. The drain regions D1 and D2 and the source regions S1 and S2 may be doped with impurities and have electrical conductivity. The channel regions A1 and A2 may be regions overlapping the gate electrodes G1 and G2 in the third direction DR3 which is the thickness direction of the substrate SUB. The source regions S2 and S2 and the drain regions D1 and D2 may be regions not overlapping the gate electrodes G1 and G2 in a plan view.

A first gate insulating layer 130 may be disposed on the first active layer. The first gate insulating layer 130 may be formed of an inorganic layer, for example, a silicon nitride layer, a silicon oxynitride layer, a silicon oxide layer, a titanium oxide layer, or an aluminum oxide layer.

The second capacitor electrode CE2 and the first gate electrode G1 of the first thin film transistor TFT1 may be disposed on the first gate insulating layer 130. In the drawing, the first gate electrode G1 and the second capacitor electrode CE2 may be spaced apart from each other, and the first gate electrode G1 and the second capacitor electrode CE2 may be connected to each other. The second gate electrode G2 of the second thin film transistor TFT2 may be disposed on the first gate insulating layer 130. Each of the first gate electrode G1, the second capacitor electrode CE2, and the second gate electrode G2 may be formed as a single layer or multiple layers made of (or including) at least one of molybdenum (Mo), aluminum (Al), chromium (Cr), gold (Au), titanium (Ti), nickel (Ni), neodymium (Nd), copper (Cu), and an alloy thereof. However, the disclosure is not limited thereto.

A first interlayer insulating layer 141 may be disposed on the first gate electrode G1 of the first thin film transistor TFT1, the second capacitor electrode CE2, and the second gate electrode G2 of the second thin film transistor TFT2. The first interlayer insulating layer 141 may be formed of an inorganic layer, for example, a silicon nitride layer, a silicon oxynitride layer, a silicon oxide layer, a titanium oxide layer, or an aluminum oxide layer.

A first capacitor electrode CE1 may be disposed on the first interlayer insulating layer 141. The first capacitor electrode CE1 may overlap the second capacitor electrode CE2 of the first thin film transistor TFT1 in the third direction DR3. The capacitor Cst may be formed by the second capacitor electrode CE2, the first capacitor electrode CE1, and a portion of the first interlayer insulating layer 141 disposed between the second capacitor electrode CE2 and the first capacitor electrode CE1. The first capacitor electrode CE1 may be formed as a single layer or multiple layers made of at least one of molybdenum (Mo), aluminum (Al), chromium (Cr), gold (Au), titanium (Ti), nickel (Ni), neodymium (Nd), copper (Cu), and an alloy thereof. However, the disclosure is not limited thereto.

A second interlayer insulating layer 142 may be disposed on the first capacitor electrode CE1. The second interlayer insulating layer 142 and the first interlayer insulating layer 141 may contain a same material.

First anode connection electrodes ANE11 and ANE21 may be disposed on the second interlayer insulating layer 142. The first anode connection electrodes ANE11 and ANE21 may be electrically connected respectively to the drain regions D1 and D2 of thin film transistors TFT1 and TFT2 through a contact hole(s) penetrating the first gate insulating layer 130, the first interlayer insulating layer 141, and the second interlayer insulating layer 142. The first anode connection electrodes ANE11 and ANE21 may be formed as a single layer or multiple layers made of at least one of molybdenum (Mo), aluminum (Al), chromium (Cr), gold (Au), titanium (Ti), nickel (Ni), neodymium (Nd), copper (Cu), and an alloy thereof. However, the disclosure is not limited thereto.

A first planarization layer 151 may planarize the steps (or height or thickness differences) due to the thin film transistors TFT1 and TFT2. The first planarization layer 151 may be disposed on the first anode connection electrodes ANE11 and ANE21. The first planarization layer 151 may be formed of an organic layer such as acryl resin, epoxy resin, phenolic resin, polyamide resin, polyimide resin, or the like.

Second anode connection electrodes ANE12 and ANE22 may be disposed on the first planarization layer 151. The second anode connection electrodes ANE12 and ANE22 may be electrically connected respectively to the first anode connection electrodes ANE11 and ANE21 through a contact hole(s) penetrating the first planarization layer 151. The second anode connection electrodes ANE12 and ANE22 and the first anode connection electrodes ANE11 and ANE21 may contain a same material.

A second planarization layer 152 may be disposed on the second anode connection electrodes ANE12 and ANE22. The second planarization layer 152 and the first planarization layer 151 described above may contain a same material.

The light element layer PEL may be disposed on the second planarization layer 152. The light element layer PEL may include the light emitting element LEL, the photoelectric conversion device PD, and a pixel defining layer 160.

The light emitting element LEL may include the pixel electrode 170, a light emitting layer 175, and the common electrode 190. The photoelectric conversion device PD may include a sensing electrode 180, a photoelectric conversion layer 185, and the common electrode 190. The light emitting elements LEL and the photoelectric conversion devices PD may share the common electrode 190.

The pixel electrode 170 of the light emitting element LEL may be disposed on the second planarization layer 152. The pixel electrode 170 may be prepared in each pixel PX. The pixel electrode 170 may be electrically connected to the second anode connection electrode ANE12 through a contact hole penetrating the second planarization layer 152.

The pixel electrode 170 of the light emitting element LEL may have a single-layer structure including at least one of molybdenum (Mo), titanium (Ti), copper (Cu), and aluminum (Al) or have a stacked film structure, for example, a multilayer structure of ITO/Mg, ITO/MgF, ITO/Ag, or ITO/Ag/ITO including indium-tin-oxide (ITO), indium-zinc-oxide (IZO), zinc oxide (ZnO), or indium oxide (In2O3), and silver (Ag), magnesium (Mg), aluminum (Al), platinum (Pt), lead (Pb), gold (Au), or nickel (Ni), but is not limited thereto.

The sensing electrode 180 of the photoelectric conversion device PD may be disposed on the second planarization layer 152. The sensing electrode 180 may be prepared in each light sensor PS. The sensing electrode 180 may be electrically connected to the second anode connection electrode ANE22 through a contact hole penetrating the second planarization layer 152.

The sensing electrode 180 of the photoelectric conversion device PD may have a single-layer structure including at least one of molybdenum (Mo), titanium (Ti), copper (Cu), and aluminum (Al) or have a multilayer structure of ITO/Mg, ITO/MgF, ITO/Ag, or ITO/Ag/ITO. However, the disclosure is not limited thereto.

The pixel defining layer 160 may be disposed on the pixel electrode 170 and the sensing electrode 180. The pixel defining layer 160 may have an opening which exposes the pixel electrode 170, and the opening of the pixel defining layer 160 may be formed in a region overlapping the pixel electrode 170. The region, in which the exposed pixel electrode 170 and the light emitting layer 175 overlap each other in a plan view, may be defined as a light emitting region of each pixel PX.

The pixel defining layer 160 may have an opening which exposes the sensing electrode 180, and the opening of the pixel defining layer 160 may be formed in a region overlapping the sensing electrode 180. The opening exposing the sensing electrode 180 may provide a space in which the photoelectric conversion layer 185 of each light sensor PS is formed. The region, in which the exposed sensing electrode 180 and the photoelectric conversion layer 185 overlap each other in a plan view, may be defined as a light sensing region.

The pixel defining layer 160 may include an organic insulating material such as a polyacrylates resin, an epoxy resin, a phenolic resin, a polyamides resin, a polyimides resin, an unsaturated polyesters resin, a polyphenylene ethers resin, a polyphenylene sulfides resin, benzocyclobutene (BCB), etc. As another example, the pixel defining layer 160 may also include an inorganic material such as silicon nitride.

The light emitting layer 175 may be disposed on the pixel electrode 170 of the light emitting element LEL in which the opening of the pixel defining layer 160 is exposed. The light emitting layer 175 may include a high molecular material or a low molecular material, and may emit red, green, or blue light for each pixel PX. Visible light may correspond to a wavelength in a range of about 380 nm to about 780 nm. The light emitted from the emission layer 175 may contribute to image display.

When the light emitting layer 175 is formed of an organic material, a hole injecting layer (HIL) and a hole transporting layer (HTL) may be disposed at a lower portion of each emission layer 175. An electron injecting layer (EIL) and an electron transporting layer (ETL) may be stacked each other on an upper portion of each emission layer 175. Each of the layers (e.g., the hole injecting layer (HIL), the hole transporting layer (HTL), the electron injecting layer (EIL), the electron transporting layer (ETL), or the like) may be a single layer or multiple layers made of at least one organic material.

The photoelectric conversion layer 185 may be disposed on the sensing electrode 180 of the photoelectric conversion device PD exposed by the openings of the pixel defining layer 160. The photoelectric conversion layer 185 may generate photocharges in proportion to incident light. For example, the intensity of the photocharges generated by the photoelectric conversion layer 185 is increased as an intensity of incident light is increased. The incident light may be light emitted from the light source part 500 of FIG. 9 and reflected to enter the photoelectric conversion layer 185. Charges generated and accumulated in the photoelectric conversion layer 185 may be converted into electrical signals required for sensing the fingerprint F.

The photoelectric conversion layer 185 may include an electron donating material and an electron accepting material. The electron donating material of the photoelectric conversion layer 185 may generate donor ions in response to light, and the electron accepting material of the photoelectric conversion layer 185 may generate acceptor ions in response to the light. The photoelectric conversion layer 185 may be formed of an organic material, and may include compound (or material) sensitive to infrared light. The infrared light may correspond to a wavelength in a range of about 780 nm to about 1,000 nm.

In some embodiments, when the photoelectric conversion layer 185 is formed of an inorganic material, the photoelectric conversion device PD may be a pn-type or pin-type phototransistor. For example, the photoelectric conversion layer 185 may have a structure in which an N-type semiconductor layer, an I-type semiconductor layer, and a P-type semiconductor layer are sequentially stacked.

When the photoelectric conversion layer 185 is formed of the organic material, a hole injecting layer (HIL) and a hole transporting layer (HTL) may be disposed at a lower portion of each photoelectric conversion layer 585, and an electron injecting layer (EIL) and an electron transporting layer (ETL) may be stacked each other on an upper portion of each photoelectric conversion layer 585. Each of the layers (e.g., the hole injecting layer (HIL), the hole transporting layer (HTL), the electron injecting layer (EIL), the electron transporting layer (ETL), or the like) may be a single layer or multiple layers made of an organic material.

The common electrode 190 may be disposed on the light emitting layers 175, the photoelectric conversion layers 185, and the pixel defining layer 160. The common electrode 190 may be disposed throughout the pixels PX and the light sensors PS, and may cover the light emitting layers 175, the photoelectric conversion layers 185, and the pixel defining layer 160. The common electrode 190 may include a layer having a small work function. For example, the common electrode 190 may include at least one of Li, Ca, LiF/Ca, LiF/Al, Al, Mg, Ag, Pt, Pd, Ni, Au, Nd, Ir, Cr, BaF, and Ba, or compounds or mixtures thereof (e.g., a mixture of Ag and Mg, etc.). As another example, the common electrode 190 may include transparent metal oxide including at least one of indium-tin-oxide (ITO), indium-zinc-oxide (IZO), and zinc oxide (ZnO).

An encapsulation layer TFEL may be disposed on the light element layer PEL. The encapsulation layer TFEL may include at least one inorganic film and prevent oxygen or moisture from permeating into the light element layer PEL. The encapsulation layer TFEL may include at least one organic film and protect the light element layer PEL from foreign materials such as dust. For example, the encapsulation layer TFEL may include a first encapsulation inorganic film TFE1, an encapsulation organic film TFE2, and a second encapsulation inorganic film TFE3. The first encapsulation inorganic film TFE1 and the second encapsulation inorganic film TFE3 may be formed as multiple films in which one or more inorganic films of a silicon nitride layer, a silicon oxynitride layer, a silicon oxide layer, a titanium oxide layer, and an aluminum oxide layer are alternately stacked. The encapsulation organic film TFE2 may be an organic film made of an acryl resin, an epoxy resin, a phenolic resin, a polyamide resin, a polyimide resin, or the like. However, the disclosure not limited thereto.

The transparent coupling member 30, the low refractive coating layer 90, and the window 20 may be further disposed on the encapsulation layer TFEL.

Figure 12:
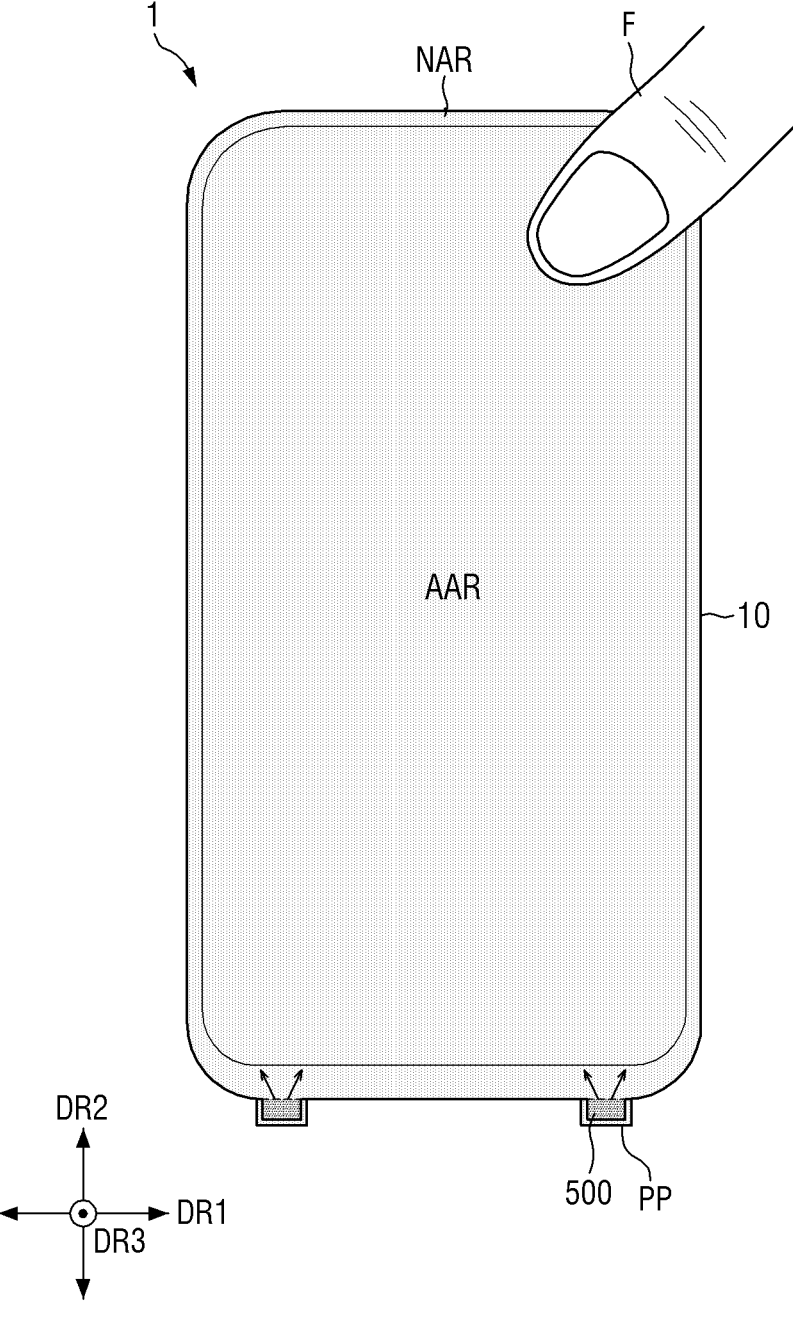
FIG. 12 is a schematic plan view illustrating a light guiding area of a light source part according to an embodiment.

FIG. 12 is a schematic plan view illustrating a light guiding area of a light source part according to an embodiment.

Referring to FIG. 12, the light source part 500 may be mounted on the protrusion pattern PP of the lower end of the display panel 10 and provide totally reflected infrared light to the front surface of the display panel 10. Accordingly, the display device 1 may display an image and the user's fingerprint F may be identified.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a main region including an active region;
a bending region extending from a side of the main region in a first direction;
a plurality of pixels disposed in the active region and emitting light;
a plurality of light sensors disposed in the active region and sensing incident light;
a protrusion pattern protruding from the side of the main region in the first direction; and
a light source part mounted on the protrusion pattern and emitting light.

2. The display device of claim 1, wherein the protrusion pattern is arranged parallel to the bending region in another direction intersecting the first direction.

3. The display device of claim 2, further comprising:
a slit portion disposed between the protrusion pattern and the bending region,
wherein the protrusion pattern and the bending region are physically separated by the slit portion.

4. The display device of claim 1, wherein the side of the main region in the first direction extends from the bending region and the protrusion pattern.

5. The display device of claim 1, wherein the protrusion pattern includes:
a first protrusion pattern; and
a second protrusion pattern, and
the bending region is disposed between the first protrusion pattern and the second protrusion pattern in another direction intersecting the first direction.

6. The display device of claim 1, further comprising:
a window disposed on the plurality of pixels, the plurality of light sensors, and the light source part.

7. The display device of claim 6, further comprising:
a transparent bonding member disposed between the window and the light source part,
wherein the light source part is attached to the window via the transparent bonding member.

8. The display device of claim 6, wherein
the window includes an angular filter overlapping the light source part in a plan view, and
the angular filter includes an optical multilayer, the optical multilayer including a plurality of low refractive layers and a plurality of high refractive layers alternately disposed.

9. The display device of claim 8, wherein the angular filter further comprises an ink layer absorbing light of a visible wavelength band and transmitting light of an infrared wavelength band.

10. The display device of claim 6, further comprising:
a non-active region adjacent to the active region, the non-active region including:
a first region overlapping the light source part in a plan view; and
a second region not overlapping the light source part in the plan view;
an angular filter disposed below a rear surface of the window, the angular filter disposed in the first region of the non-active region; and
a black matrix disposed below the rear surface of the window, the black matrix disposed in the second region of the non-active region.

11. The display device of claim 1, wherein the light source part comprises:
a light emitting chip emitting light of infrared wavelength band;
a first lead frame electrically connected to an end portion of the light emitting chip;
a second lead frame electrically connected to another end portion of the light emitting chip; and
a reflector providing a space in which the light emitting chip is mounted.

12. The display device of claim 1, wherein:
the light source part is electrically connected to a light source voltage line extending from the bending region toward the protrusion pattern, and
the light source voltage line supplies a power of a first polarity and a power of a second polarity different from the first polarity to the light source part.

13. The display device of claim 1, wherein:
the plurality of pixels emit light of visible wavelength band, and
the light source part emits light of infrared wavelength band.

14. The display device of claim 13, wherein the plurality of light sensors sense light of the infrared wavelength band.

15. An electronic device comprising:

a display panel including:

a plurality of pixels emitting light; and a plurality of light sensors sensing incident light;

a protrusion pattern protruding from a side of the display panel;

a light source part mounted on the protrusion pattern; and a window disposed on the display panel, the protrusion pattern, and the light source part, wherein the light source part is attached to the window via a transparent bonding member.

16. The electronic device of claim 15, further comprising:

an angular filter disposed below a rear surface of the window, wherein the angular filter overlaps the light source part in a plan view.

17. The electronic device of claim 16, wherein:

the angular filter includes:

an optical multilayer sequentially stacked in a thickness direction of the display panel; and an ink layer, the optical multilayer includes:

a plurality of low refractive layers; and a plurality of high refractive layers, the plurality of low refractive layers and the plurality of high refractive layers of the optical multilayer are alternately disposed, and the ink layer absorbs light of visible wavelength band.

18. The electronic device of claim 16, wherein the light source part, the transparent bonding member, the angular filter, and the window are sequentially stacked in a thickness direction of the display panel.

19. The electronic device of claim 15, wherein:

the display panel includes:

a main region including the plurality of pixels and the plurality of light sensors;

a sub-region including a pad portion; and a bending region disposed between the sub-region and the main region, and the protrusion pattern is arranged parallel to the bending region.

20. The electronic device of claim 15, wherein the display panel comprises:

a substrate;

a pixel electrode disposed on the substrate;

a sensing electrode disposed on the substrate;

a pixel defining layer exposing the pixel electrode and the sensing electrode;

a light emitting layer disposed on the pixel electrode;

a photoelectric conversion layer disposed on the sensing electrode; and a common electrode disposed on the light emitting layer, the photoelectric conversion layer, and the pixel defining layer.

* * * * *